United States Patent
Nakahashi et al.

(10) Patent No.: US 6,940,369 B2
(45) Date of Patent: Sep. 6, 2005

(54) SURFACE ACOUSTIC WAVE DEVICE HAVING EXCELLENT BALANCING CHARACTERISTICS BETWEEN BALANCED TERMINALS AND A COMMUNICATION DEVICE USING THE SAME

(75) Inventors: Norihiko Nakahashi, Ishikawa-ken (JP); Masaru Yata, Ishikawa-ken (JP); Norihiko Takada, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 93 days.

(21) Appl. No.: 10/438,919

(22) Filed: May 16, 2003

(65) Prior Publication Data

US 2004/0012465 A1 Jan. 22, 2004

(30) Foreign Application Priority Data

May 16, 2002 (JP) ........................................ 2002-141712
Apr. 4, 2003 (JP) ........................................ 2003-100984

(51) Int. Cl.[7] .............................................. H03H 9/64
(52) U.S. Cl. ........................ 333/195; 333/193; 333/194
(58) Field of Search ................................. 333/193, 194, 333/195, 196

(56) References Cited

U.S. PATENT DOCUMENTS

| 6,731,188 B2 * | 5/2004 | Sawada et al. .............. 333/195 |
| 6,744,333 B2 * | 6/2004 | Sawada ...................... 333/195 |
| 6,771,144 B2 * | 8/2004 | Takamine ................... 333/195 |
| 2003/0035557 A1 | 2/2003 | Takamine et al. |

FOREIGN PATENT DOCUMENTS

| EP | 1 126 605 A2 | 8/2001 |
| EP | 1 227 584 A1 | 7/2002 |

* cited by examiner

*Primary Examiner*—Michael Tokar
*Assistant Examiner*—Lam T Mai
(74) *Attorney, Agent, or Firm*—Keating & Bennett, LLP

(57) ABSTRACT

A surface acoustic wave filter has one or more surface acoustic wave filter elements having at least two comb-shaped electrode portions disposed along a propagation direction of a surface acoustic wave and first and second balanced terminals connected to the comb-shaped electrode portions provided on a piezoelectric substrate. The surface acoustic wave filter is housed in a packaging member such that the difference in capacitance between electrodes on the piezoelectric substrate, which are connected to the first and second balanced terminals, is greatly reduced.

22 Claims, 29 Drawing Sheets

SURFACE ACOUSTIC WAVE DEVICE HAVING EXCELLENT BALANCING CHARACTERISTICS BETWEEN BALANCED TERMINALS AND A COMMUNICATION DEVICE USING THE SAME

BACKGROUND OF THE INVENTION

1. Field of the Invention

The present invention relates to a surface acoustic wave device having excellent balancing characteristics between balanced terminals and being suitable as filters in duplexers of communication devices, etc., and the present invention also relates to a communication device including the surface acoustic wave device.

2. Description of the Related Art

In recent years, technical advances in reducing the size and weight of portable telephones have been remarkable. To realize these, not only reduction in the number of parts and their size, but also development of multifunctional parts is in progress. Under such conditions, surface acoustic wave devices having a filtering function which are used in the RF stage of portable telephones, the surface acoustic wave devices also having a balanced-to-unbalanced conversion function or a so-called balun function, have been intensively studied in recent years and have come to be used primarily in GSM (Global System for Mobile communications) devices, etc. Furthermore, surface acoustic wave devices have begun to be used in AMPS, PCS, DCS, etc., and it is considered that the demand for surface acoustic wave devices having such a balanced-to-unbalanced conversion function will further increase.

In surface acoustic wave filters to be used in surface acoustic wave devices having a balanced-to-unbalanced conversion function, the construction shown in FIG. 27 is widely used. In the construction in FIG. 27, longitudinally-coupled surface acoustic wave filter elements 101 and 102 are mounted on a piezoelectric substrate 118 such that terminals of each are electrically connected in parallel and that the other terminals of each are connected in series. The surface acoustic wave filter element 101 is provided with three comb-shaped electrode portions (interdigital transducers, hereinafter referred to as IDTs) 104, 103, and 105 and is also provided with reflectors 106 and 107 so as to sandwich the IDTs 104, 103, and 105. The surface acoustic wave filter element 102 is provided with three IDTs 109, 108, and 110 along the propagation direction of a surface acoustic wave and is also provided with reflectors 111 and 112 so as to sandwich the IDTs 109, 108, and 110.

The difference between the surface acoustic wave filter element 101 and the surface acoustic wave filter element 102 is that the IDT 103 is opposite in polarity to the IDT 108. Thus, the signals output from terminals 114 and 115 are 180 degrees out of phase from each other, and an unbalanced signal input from a terminal 113 is converted and output as a balanced signal between the terminals 114 and 115.

In a surface acoustic wave filter having a balanced-to-unbalanced conversion function, regarding the transmission characteristics in the passband between the unbalanced terminal and each of the balanced terminals, it is required that the amplitude characteristics be equal and the phase difference be 180 degrees. Furthermore, outside the passband, both the amplitude characteristics and the phase characteristics should be equal.

Regarding the amplitude balancing and phase balancing, when the above-described surface acoustic wave device having a balanced-to-unbalanced conversion function is considered to be a three-port device in which, for example, the unbalanced input terminal is assumed to be a first port and the balanced output terminals are assumed to be a second port and third port, respectively, the amplitude balancing and phase balancing are defined as follows:

Amplitude balancing=$|A|$, $A=|20 \log(S21)|-|20 \log(S31)|$ phase balancing=$|B-180|$         (1)

wherein $B=|\angle S21-\angle S31|$.

Here, when a three-port device is expressed as a scattering matrix, S21 and S31 represent components of the matrix and show the transmission characteristics between port 2 and port 1 and between port 3 and port 1, respectively. Regarding such balancing, it is accepted that ideally the amplitude balancing is 0 dB and the phase balancing is zero degree inside the passband of the filter, and the amplitude balancing is 0 dB and the phase balancing is 180 degrees outside the passband.

As shown in FIGS. 28 and 29, in a related surface acoustic wave filter 100 having a balanced-to-unbalanced conversion function, a piezoelectric substrate 118 is fixed to a packaging member 120 by an adhesive layer 122. Furthermore, the packaging member 120 is made of, for example, dielectric ceramics such as alumina, etc. In such a surface acoustic wave device, as shown in FIG. 29, the surface acoustic wave filter 100 is housed inside the packaging member 120 by using the adhesive layer 122 and is electrically connected to the packaging member 120 through a bonding wire 123, and then sealed by using a cap 124 as a cover.

When the surface acoustic wave filter 100 having a balanced-to-unbalanced conversion function is die bonded (fixed) to the packaging member 120 by using the adhesive layer 122, coating locations of the adhesive layer 122 vary and mounting locations of the surface acoustic wave filter 100 vary in the packaging member 120.

Therefore, in related products, there is a problem in that capacitances between electrodes and lead wires of the IDTs on the top surface of the surface acoustic wave filter 100 and metalized patterns (electrode terminals) on the packaging member 120 vary and that the balancing, the phase balancing in particular, greatly varies. Moreover, such variations of the balancing also occur in surface acoustic wave filters with balanced inputting and outputting.

SUMMARY OF THE INVENTION

In order to solve the above-described problems, preferred embodiments of the present invention provide a greatly improved surface acoustic wave filter that a surface acoustic wave device of preferred embodiments of the present invention includes a piezoelectric substrate, one or more surface acoustic wave filters including at least two comb-shaped electrode portions formed along the propagation direction of a surface acoustic wave on the piezoelectric substrate, and first and second balanced terminals connected to the comb-shaped electrode portions; and a packaging member for housing the surface acoustic wave filter. In the surface acoustic wave device, the surface acoustic wave filter is housed in the packaging member such that a capacitance generated at an electrode on the piezoelectric substrate which is connected to the first balanced terminal is substantially equal to a capacitance generated at an electrode on the piezoelectric substrate which is connected to the second balanced terminal.

Another surface acoustic wave device of the present invention comprises a piezoelectric substrate; one or more surface acoustic wave filters including at least two comb-shaped electrode portions formed along the propagation direction of a surface acoustic wave on the piezoelectric substrate, and first and second balanced terminals connected to the comb-shaped electrode portions; and a packaging member for housing the surface acoustic wave filter. In the surface acoustic wave device, the surface acoustic wave filter is fixed to the packaging member by adhesive layers at two or more locations at least between the first balanced terminal and the packaging member and between the second balanced terminal and the packaging member.

According to the above construction, even if variations in the accuracy of the assembly occur, since the capacitances generated at the electrodes connected to terminals for inputting or outputting a balanced signal do not change excessively and also because the capacitances are set to substantially agree with each other, or since the surface acoustic wave filter is fixed to the packaging member by adhesive layers at two or more locations between the first and second balanced terminals and the packaging member, the balancing between balanced terminals, particularly the phase balancing in the passband, can be improved.

The above electrodes include IDTs, lead wires, and wire bonding pads. The above capacitances are the capacitances generated between the above electrodes and the surface on which the surface acoustic wave filter is mounted and the side wall of the packaging member. The capacitances include grounding capacitance and stray capacitance. The grounding capacitance is the capacitance generated between the above electrodes and the grounding surface, and the stray capacitance is the capacitance between the electrodes and floating electrodes. Both capacitances function in the same way, and, if the capacitances vary, the phase balancing will also vary.

In the surface acoustic wave device, it is desirable that the surface acoustic wave device be fixed to the packaging member by using an adhesive layer and that the adhesive layer be formed at least between the first balanced terminal and the packaging member and between the second balanced terminal and the packaging member.

According to the above construction, since adhesive layers are formed between the first and second balanced terminals and the packaging member, a difference in capacitance between the first and second balanced terminals and the electrodes of the packaging member can be reduced and accordingly variations in the phase balancing can be more assuredly improved.

In the surface acoustic wave device, it is desirable that the surface acoustic wave filter be fixed to the packaging member by adhesive layers at two or more locations. According to the above construction, since the surface acoustic wave filter is fixed to the packaging member by adhesive layers at two or more locations, the adhesive layers are more assuredly formed between the first and second balanced terminals and the packaging member, a difference in capacitance generated between the first and second balanced terminals and the electrodes of the packaging member is reduced, and variations in the phase balancing can be more assuredly improved.

In the surface acoustic wave device, it is desirable that the adhesive layer be formed over an area wider than the electrodes on the piezoelectric substrate which are connected to the first and second balanced terminals. According to this construction, since adhesive layers are formed in an area which is larger than the electrodes on the piezoelectric substrate connected to the first and second balanced terminals, the adhesive layers are more securely formed between the first and second balanced terminals and the packaging member, a difference in capacitance generated between the first and second balanced terminals and the electrodes of the packaging member is reduced, and accordingly variations in the phase balancing can be more assuredly improved.

In the surface acoustic wave device, substantially the whole area of a surface of the packaging member, on which the surface acoustic wave filter is mounted, may be metalized.

In the surface acoustic wave device, substantially the whole area of a surface of the packaging member, on which the surface acoustic wave filter is mounted, may not be metallic.

In the surface acoustic wave device, it is desirable that the surface acoustic wave filter be fixed to the packaging member by flip chip bonding and that metalized patterns formed on a surface of the packaging member, on which the surface acoustic wave filter is mounted, to be connected to lead-out electrodes connected to the first and second balanced terminals, be wider than the lead-out electrodes connected to the first and second balanced terminals.

According to the above construction, since the metalized pattern on the packaging member is formed on an area which is larger than the lead-out electrodes connected to the first and second balanced terminals, a difference in the distances between the first and second balanced terminals and the electrodes of the packaging member can be reduced and accordingly variations in the phase balancing can be more assuredly improved.

In the surface acoustic wave device, the metalized patterns formed on a surface of the packaging member, on which the surface acoustic wave filter is mounted, may be made symmetrical. According to this construction, the metalized patterns are symmetrical, a difference in capacitance between the first and second balanced terminals connected to the metalized patterns can be reduced and accordingly variations in the phase balancing can be more assuredly improved.

In the surface acoustic wave device, it is desirable that the distance between the electrode on the piezoelectric substrate connected to the first balanced terminal and the packaging member be substantially equal to the distance between the electrode on the piezoelectric substrate connected to the second balanced terminal and the packaging member.

In the surface acoustic wave device, it is desirable that the distance between the electrode on the piezoelectric substrate connected to the first balanced terminal and the side wall of the packaging member be substantially equal to the distance between the electrode on the piezoelectric substrate connected to the second balanced terminal and the side wall of the packaging member.

In the surface acoustic wave device, the distance between the electrode on the piezoelectric substrate connected to the first balanced terminal and the metalized pattern of the packaging member is substantially equal to the distance between the electrode on the piezoelectric substrate connected to the second balanced terminal and the metalized pattern of the packaging member.

According to the above construction, since the distances are made equal to each other, a difference in capacitance between the first and second balanced terminals connected to the packaging member, the side wall of the packaging member, and the metalized pattern can be reduced and accordingly variations in the phase balancing can be more assuredly improved.

In the surface acoustic wave device, it is desirable that the surface acoustic wave filter has a balanced-to-unbalanced conversion function. Furthermore, a balanced input and a balanced output may be provided on the surface acoustic wave device.

In a communication device of the present invention, a surface acoustic wave device of the present invention is provided therein. According to the above construction, since the surface acoustic wave device has excellent phase balancing characteristics, the communication device can be improved.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of a surface acoustic wave device according to the present invention will be described based on FIGS. 1 to 25.

First Preferred Embodiment

Figure 1:
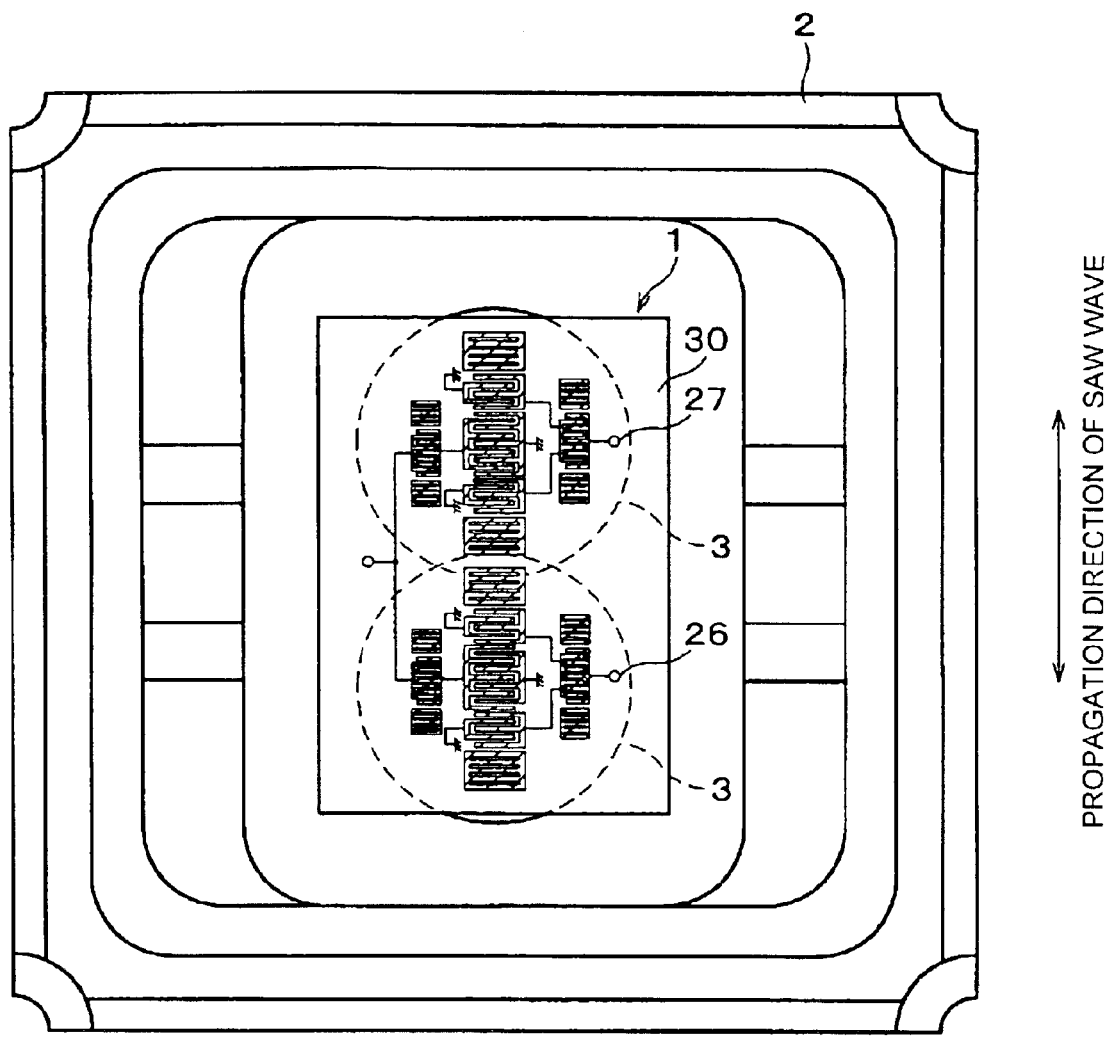
FIG. 1 is a top view of a surface acoustic wave device according to a first preferred embodiment of the present invention, the device being not yet sealed with a cap.

In a surface acoustic wave device of the present preferred embodiment of the present invention, as shown in FIG. 1, a surface acoustic wave filter 1 is die bonded (fixed) inside a packaging member 2 by using a plurality of adhesive layers 3.

It is desirable that the plurality of adhesive layers 3 be provided along the propagation direction of a surface acoustic wave (hereinafter referred to as a SAW wave), that is, in the direction in which balanced terminals are aligned, and it is more desirable that the adhesive layers be formed on the central axis in the propagation direction of the SAW wave.

Furthermore, the balanced terminals 26 and 27 of the surface acoustic wave filter 1 are provided on the upper surface, opposite to the adhesive layers 3, of a piezoelectric substrate 30. It is desirable that the adhesive layers corresponding to the balanced terminals 26 and 27 be formed so as to be substantially the same as each other. Moreover, it is desirable that the adhesive layers 3 be provided on the lower surface, opposite to the balanced terminals 26 and 27, of the piezoelectric substrate 30 underneath the balanced terminals 26 and 27.

Figure 2:
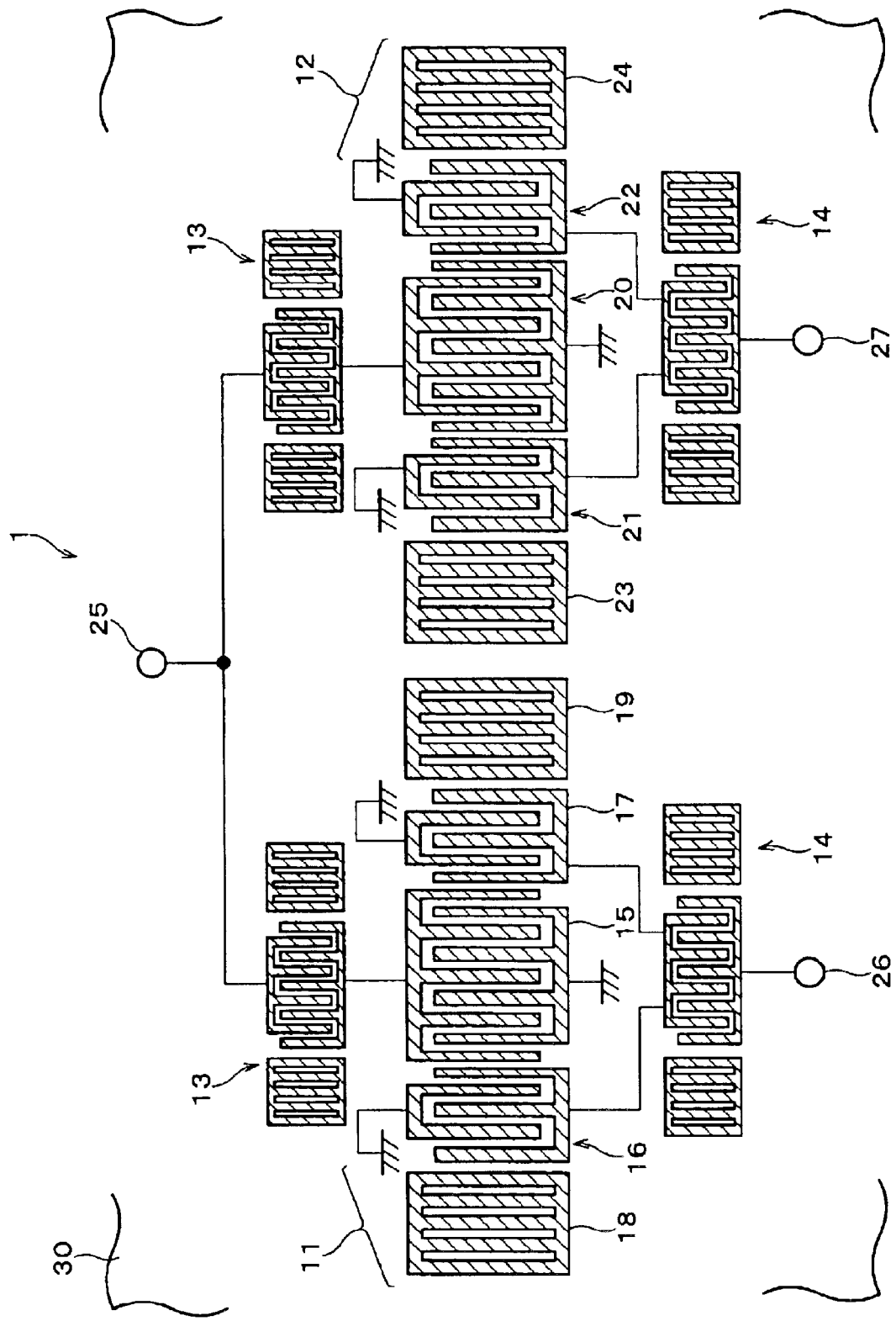
FIG. 2 shows the construction in outline of the surface acoustic wave filter included in the surface acoustic wave device in FIG. 1.

First of all, the surface acoustic wave filter 1 will be described. As shown in FIG. 2, surface acoustic wave filter elements 11 and 12 are provided in the propagation direction of a SAW wave on the piezoelectric substrate 30. Terminals of each of the surface acoustic wave filter elements 11 and 12 are electrically connected in parallel to an unbalanced terminal 25, and the other terminals of each are connected in series to the balanced terminals 26 and 27. Therefore, the electrodes constituting the balanced terminals 26 and 27 are arranged so as to stand in line in the propagation direction of the SAW wave on the surface of the piezoelectric substrate 30 where IDTs are located.

Moreover, a surface acoustic wave resonator 13 having a pair of terminals is inserted between the surface acoustic wave filter element 11 and the unbalanced terminal 25 and between the surface acoustic wave filter element 12 and the unbalanced terminal 25, respectively. A surface acoustic wave resonator 14 having a pair of terminals is inserted between the surface acoustic wave filter element 11 and the balanced terminal 26 and between the surface acoustic wave filter element 12 and the balanced terminal 27, respectively.

The surface acoustic wave filter element 11 is provided with IDTs 16, 15, and 17 and also includes reflectors 18 and 19, which sandwich the IDTs 16, 15, and 17. The surface acoustic wave filter element 12 is provided with three IDTs 21, 20, and 22 along the propagation direction of a SAW wave and also includes reflectors 23 and 24, which sandwich the IDTs 21, 20, and 22.

The IDTs and reflectors preferably made of aluminum electrodes are formed by photolithography, or other suitable process. Each IDT is provided with two electrode-finger portions, each having a strip-shaped base portion (bus bar) and a plurality of electrode fingers, parallel to each other, which extends from one side of the base portion in the direction perpendicular to the base portion, and the electrode fingers of one electrode-finger portion are inserted between the electrode fingers of the other electrode-finger portion such that the electrode fingers of one electrode-finger portion face the electrode fingers of the other electrode-finger portion.

In such IDTs, the signal conversion characteristics and passband can be set by fixing the length and width of each electrode finger, the space between adjacent electrode fingers, the amount of overlap indicating the length where adjacent electrode fingers face each other.

The difference between the surface acoustic wave filter element 11 and the surface acoustic wave filter element 12 is that the polarities of the IDT 15 and the IDT 20 are reversed from each other. Therefore, the signals output from the balanced terminals 26 and 27 are 180 degrees out of phase with each other. Accordingly, the surface acoustic wave filter 1 has a balanced-to-unbalanced conversion function such that an unbalanced signal input from the unbalanced terminal 25 is output as a balanced signal from the balanced terminals 26 and 27 and a balanced signal input from the balanced terminals 26 and 27 is output as an unbalanced signal from the unbalanced terminal 25.

Moreover, in the surface acoustic wave filter elements 11 and 12, the pitch of the electrode fingers in the vicinity of the boundary between IDTs (electrode fingers with a short pitch) (wavelength: λi) is preferably shorter than the pitch of other electrode fingers (wavelength: λI).

Furthermore, in designing the surface acoustic wave filter element 11 and the surface acoustic wave filter element 12, only the wavelengths of electrode fingers with a short pitch are different from each other and the other parameters are the same. The wavelengths of electrode fingers with a short pitch of the surface acoustic wave filter elements 11 and 12 are represented by λi1 and λi2, respectively.

Next, the packaging member 2 is described. As shown in FIG. 1, the packaging member 2 is preferably made of, for example, a dielectric (insulating) ceramic such as alumina or other suitable material, and is preferably formed as a box having the bottom in the form of a substantially rectangular member. Furthermore, although not illustrated, the packaging member is preferably formed so as to be sealed by using a cap.

Figure 3:
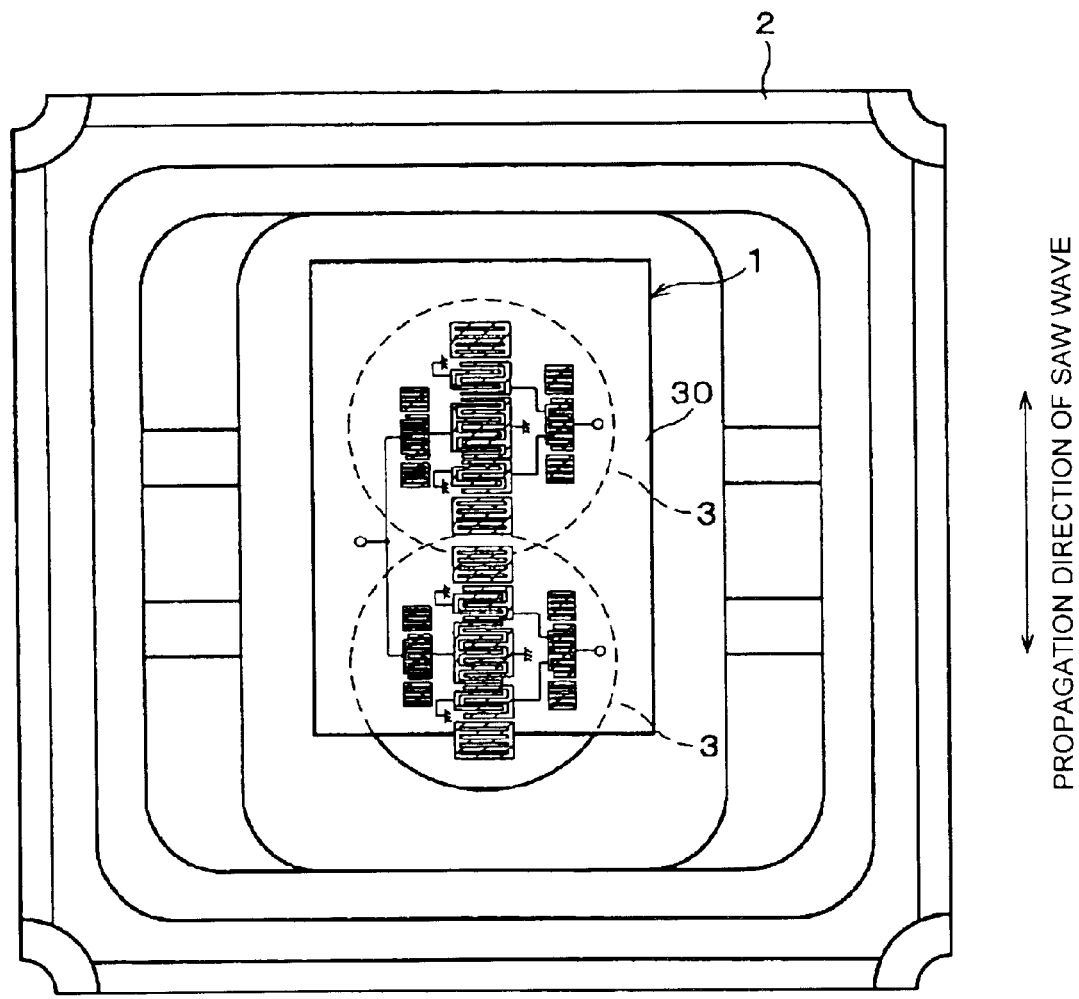
FIG. 3 is a top view of the surface acoustic wave device in FIG. 1, wherein the surface acoustic wave filter is displaced, the device being not yet sealed with a cap.
Figure 4:
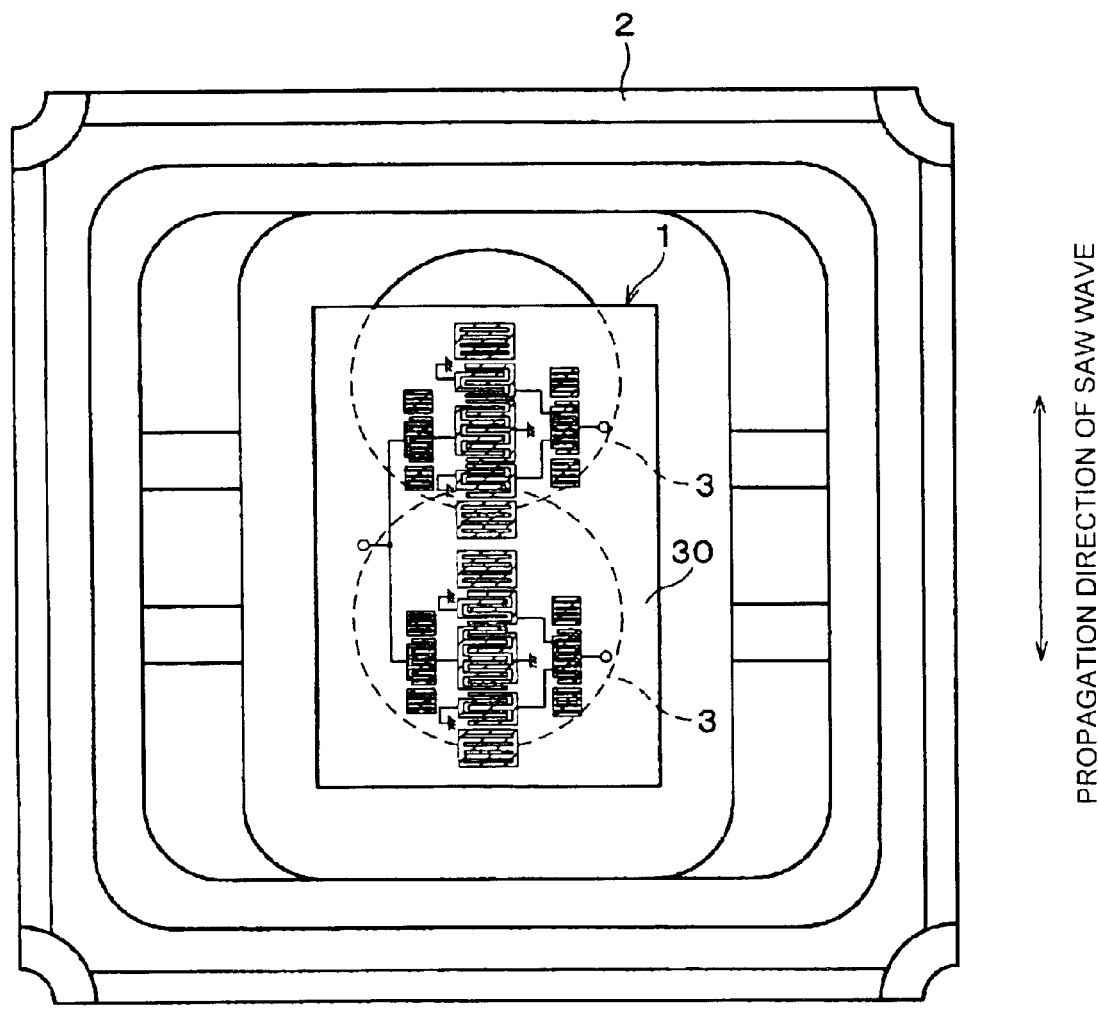
FIG. 4 is a top view of the surface acoustic wave device in FIG. 1, wherein adhesive layers for fixing the surface acoustic wave filter are displaced in the packaging member, the device being not yet sealed with a cap.

Next, when the surface acoustic wave filter 1 is die bonded to the packaging member 2 such that an adhesive is applied at two locations and spreads out over substantially the whole bottom surface of the piezoelectric substrate 30, the case in which the mounting position of the piezoelectric substrate 30 and the coating position of adhesive layers 3 are in the middle of the packaging member 2, is shown in FIG. 1, and the cases in which the positions are displaced in the direction substantially parallel to the propagation direction of the SAW wave, as shown in Table 1, are shown in FIGS. 3 and 4.

Figure 5:
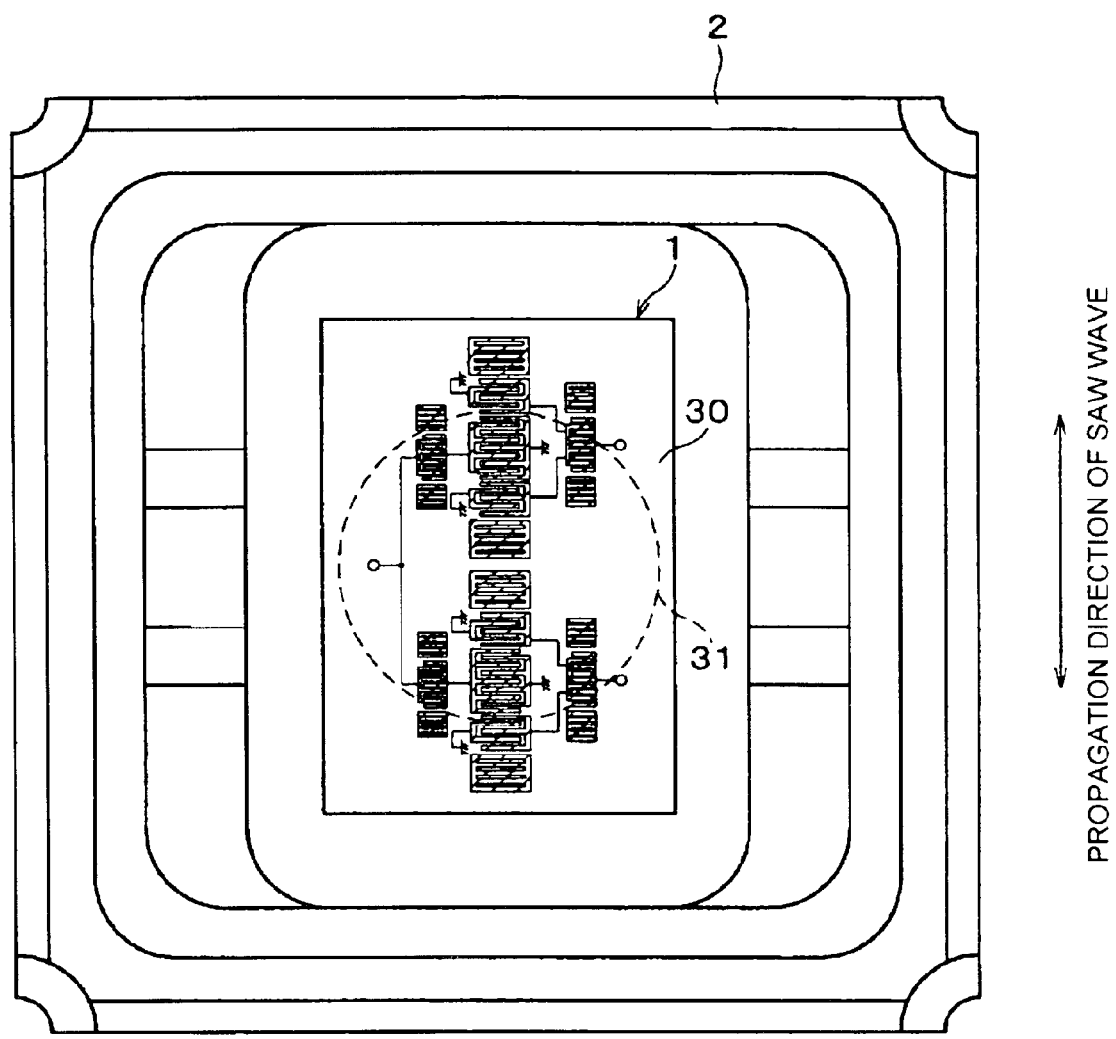
FIG. 5 is a top view of a comparative surface acoustic wave device in which adhesive is coated at one location, the device being not yet sealed with a cap.
Figure 6:
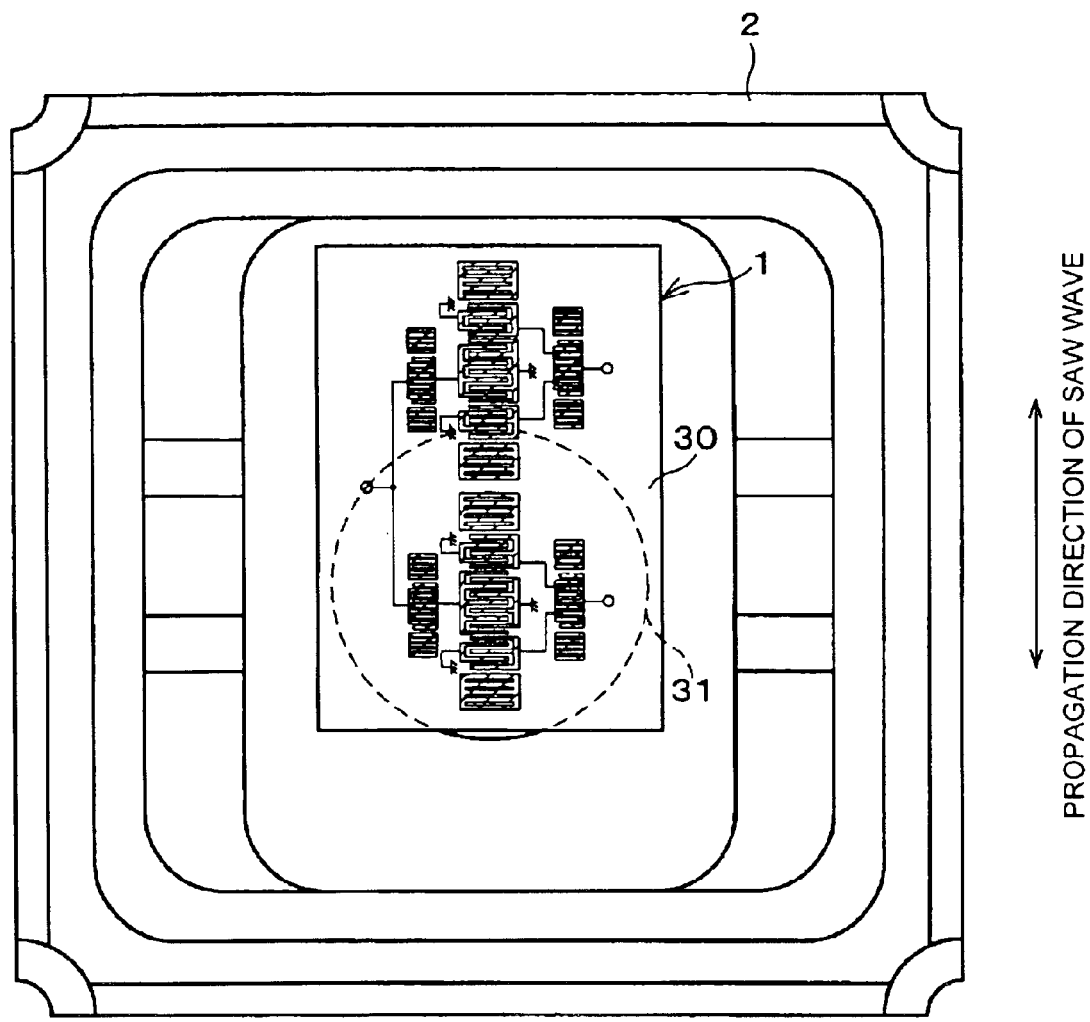
FIG. 6 is a top view of the comparative surface acoustic wave device in FIG. 5 in which the surface acoustic wave filter is displaced, the device being not yet sealed with a cap.
Figure 7:
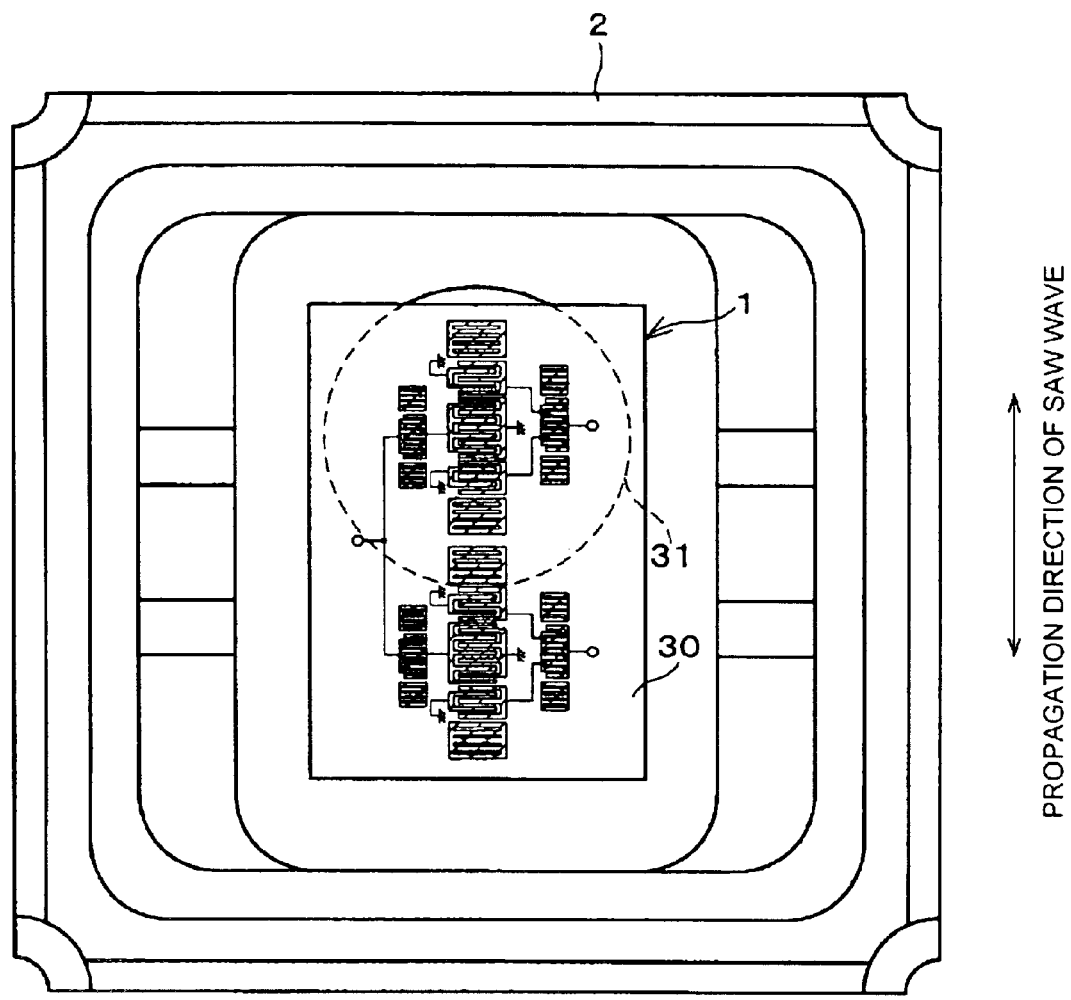
FIG. 7 is a top view of the comparative surface acoustic wave device in FIG. 5 in which the adhesive layer for fixing the surface acoustic wave filter is displaced in the packaging member, the device being not yet sealed with a cap.

Furthermore, for comparison purposes, when the surface acoustic wave filter 1 is die bonded to the packaging member 2 such that adhesive is coated at one location and spreads out over substantially the whole bottom surface of the piezoelectric substrate 30, the case in which the mounting position of the piezoelectric substrate 30 and the coating position of an adhesive layer 31 are in the middle of the packaging member 2 is shown in FIG. 5, and the cases in which the positions are displaced in the direction that is substantially parallel to the propagation direction of the SAW wave, as shown in Table 1, are shown in FIGS. 6 and 7. FIG. 1 and FIGS. 3 to 7 are schematic top views in which a cap is not attached and the adhesive is spread out over substantially the whole bottom surface of the piezoelectric substrate. Furthermore, the location of the surface acoustic wave filter 1 and the adhesive layers 3 or adhesive layer 31 in the packaging member 2 in the schematic top views FIG. 1 and FIGS. 3 to 7 are briefly shown in Table 1.

Regarding such displacements of the surface acoustic wave filter elements and the coating locations of the adhesive, the displacements occur in the length direction of the packaging member or the surface acoustic wave filter 1. Although the degree of displacement is dependent on the accuracy of the equipment, in the equipment generally used in the present preferred embodiments, the FCB displacements are in the range of about ±40 μm, the displacements of the coating locations of the adhesive are about ±50 μm, and the displacements of the mounting location of the surface acoustic wave filter 1 are ±about 100 μm. The mounting location of the surface acoustic wave filter, the coating location of the adhesive, and the amount of adhesive when the surface acoustic wave filter is die bonded to the packaging member are shown, in Table 1.

TABLE 1

|  | FIG. 1 (Coating at two locations) | FIG. 3 (Coating at two locations) | FIG. 4 (Coating at two locations) | FIG. 5 (Comparative example) | FIG. 6 (Comparative example) | FIG. 7 (Comparative example) |
|---|---|---|---|---|---|---|
| Mounting location of surface acoustic wave filter | Middle | Upper | Middle | Middle | Upper | Middle |
| Coating location of adhesive | Middle | Middle | Upper | Middle | Middle | Upper |

Next, the advantages of the present first preferred embodiment are described.

The average values of the phase balancing in the passband (1805 to 1880 MHz) corresponding to the schematic illustrations in FIG. 1 and FIGS. 3 to 7 are shown using graphs in FIGS. 8 to 13. In FIGS. 8 to 13, the phase balancing is represented by B−180, as is shown in the former formula (1) and error bars indicating variations are included in order to show the results more accurately.

Furthermore, Table 2 shows the phase balancing in the passband (1805 to 1880 MHz) in FIGS. 8 to 13. It is understood that the adhesive layers 3 can be spread over substantially the whole area of the bottom surface of the piezoelectric substrate 30 and that variations of the phase balancing can be reduced. σ in Table 2 represents the standard deviation.

TABLE 2

|  | FIG. 5 | FIG. 6 | FIG. 7 | FIG. 1 | FIG. 3 | FIG. 4 |
|---|---|---|---|---|---|---|
| Ave. | −9.66 | −8.28 | −10.16 | −9.20 | −8.13 | −9.71 |
| Max. | −7.34 | −2.40 | −3.14 | −7.75 | −5.84 | −6.88 |
| Min. | −12.58 | −15.06 | −14.52 | −10.61 | −10.21 | −11.61 |
| Σ | 0.88 | 1.86 | 1.48 | 0.69 | 0.87 | 1.06 |

(Unit: degrees, n = 50)

Figure 27:
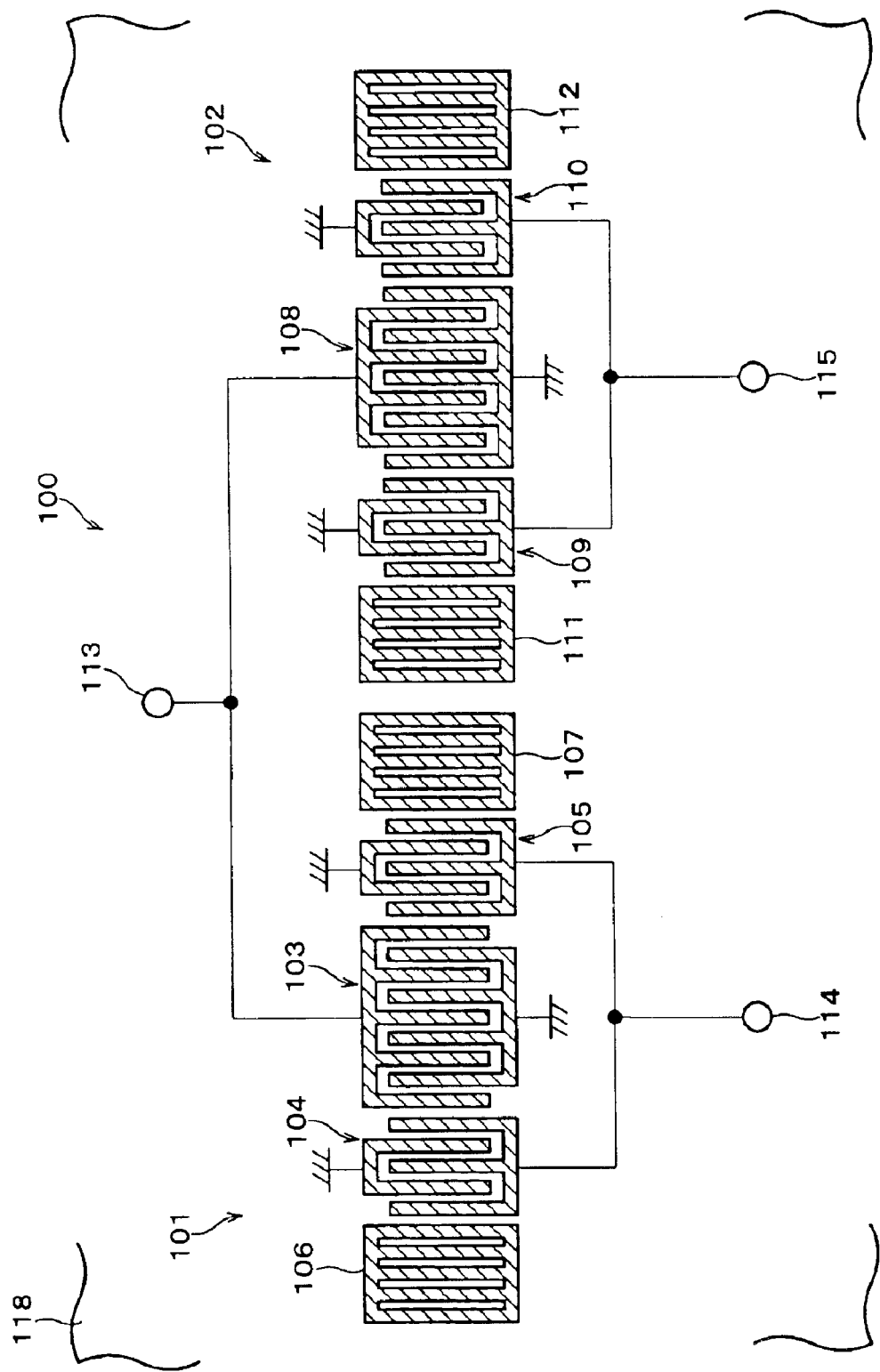
FIG. 27 shows the construction in outline of a related surface acoustic wave filter.
Figure 28:
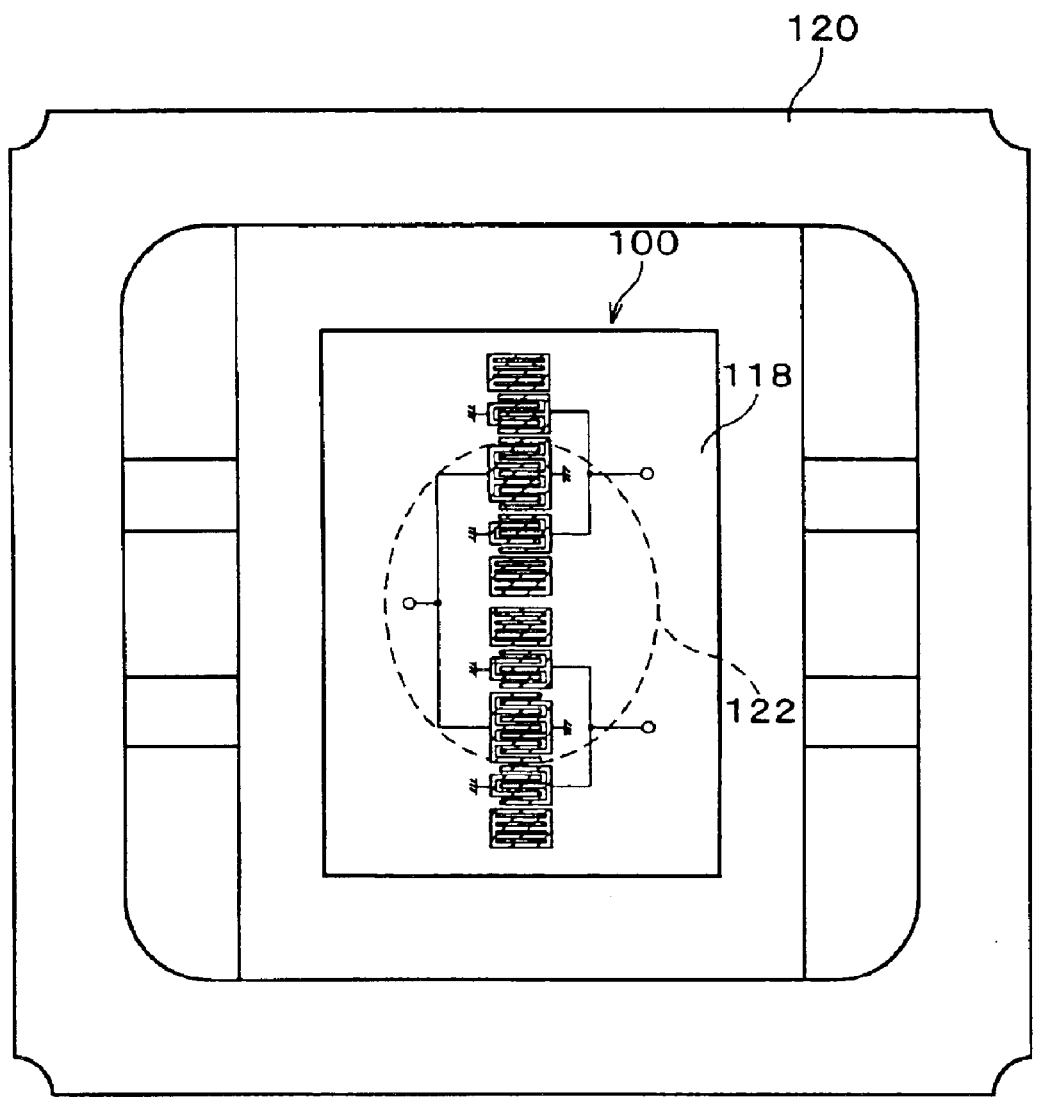
FIG. 28 is a top view of a related surface acoustic wave device in which the surface acoustic wave filter in FIG. 27 is housed in the packaging member, the device being not yet sealed with a cap.
Figure 29:
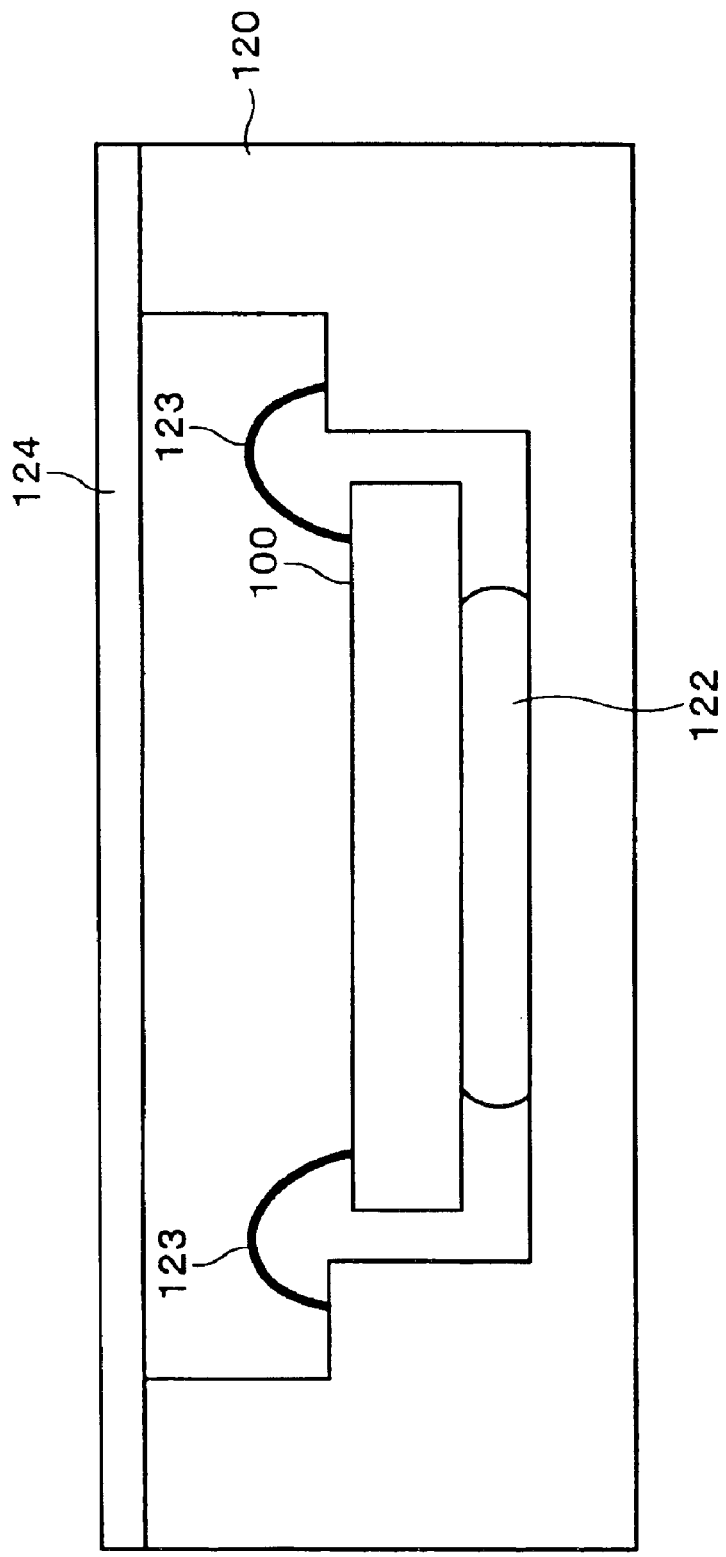
FIG. 29 is a sectional view of the surface acoustic wave device in FIG. 28.

In the surface acoustic wave filter 100 shown in FIGS. 27 and 28, the surface acoustic wave filter elements 101 and 102 are separated into two in the direction that is substantially parallel to the propagation direction of the SAW wave on the piezoelectric substrate 118. Therefore, when the mounting position of the surface acoustic wave filter 1 and the position of the adhesive layer 122 are displaced parallel to the propagation direction of the SAW wave, a situation where the adhesive layer 122 exists underneath one surface acoustic wave filter element and the adhesive layer 122 does not exist underneath another surface acoustic wave filter element occurs.

At this time, in the surface acoustic wave filter elements 101 and 102, a difference between the grounding capacitances between the surface acoustic wave filter elements 101 and 102 and the packaging member 120 occurs and this difference is considered to be the cause of variations in the phase balancing.

Figure 11:
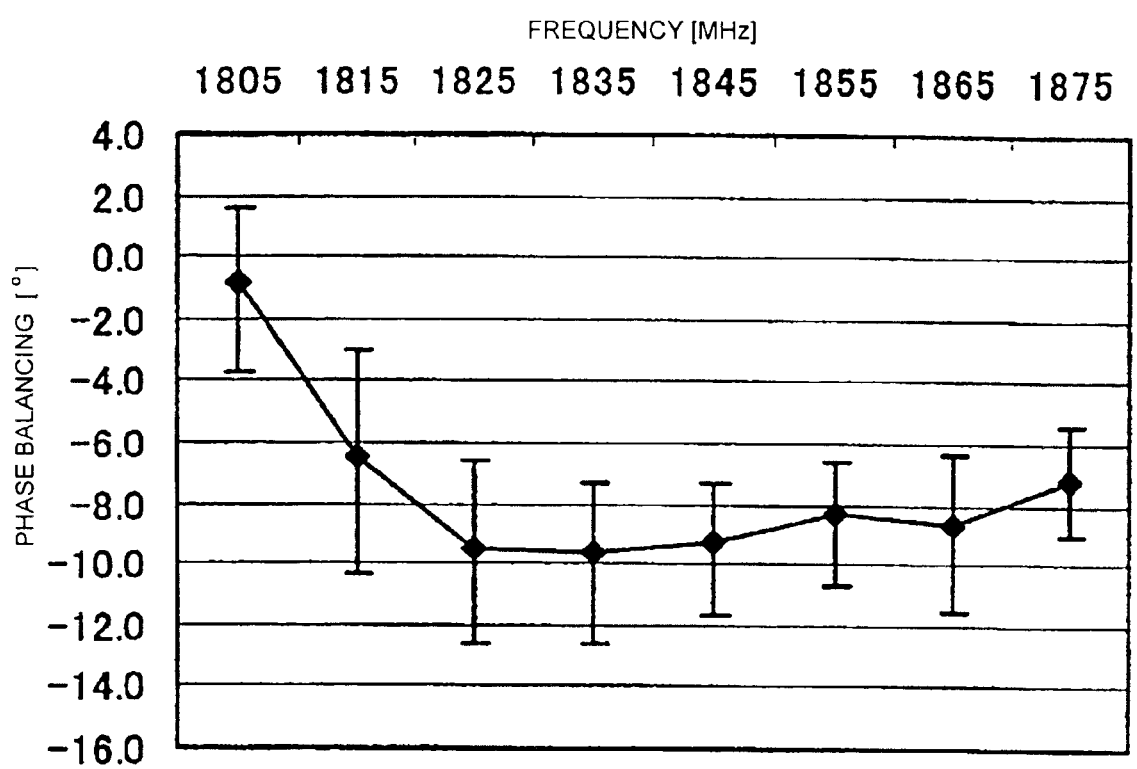
FIG. 11 is a graph showing the phase balancing in the passband of the surface acoustic wave device in FIG. 5.
Figure 12:
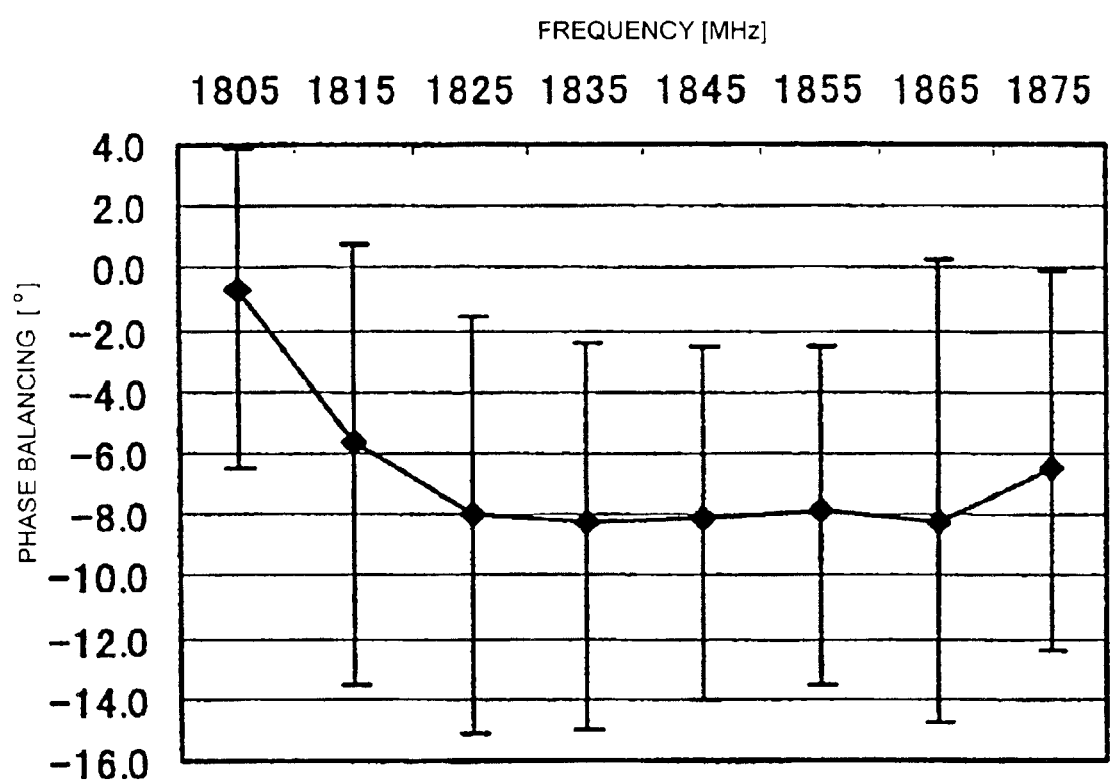
FIG. 12 is a graph showing the phase balancing in the passband of the surface acoustic wave device in FIG. 6.
Figure 13:
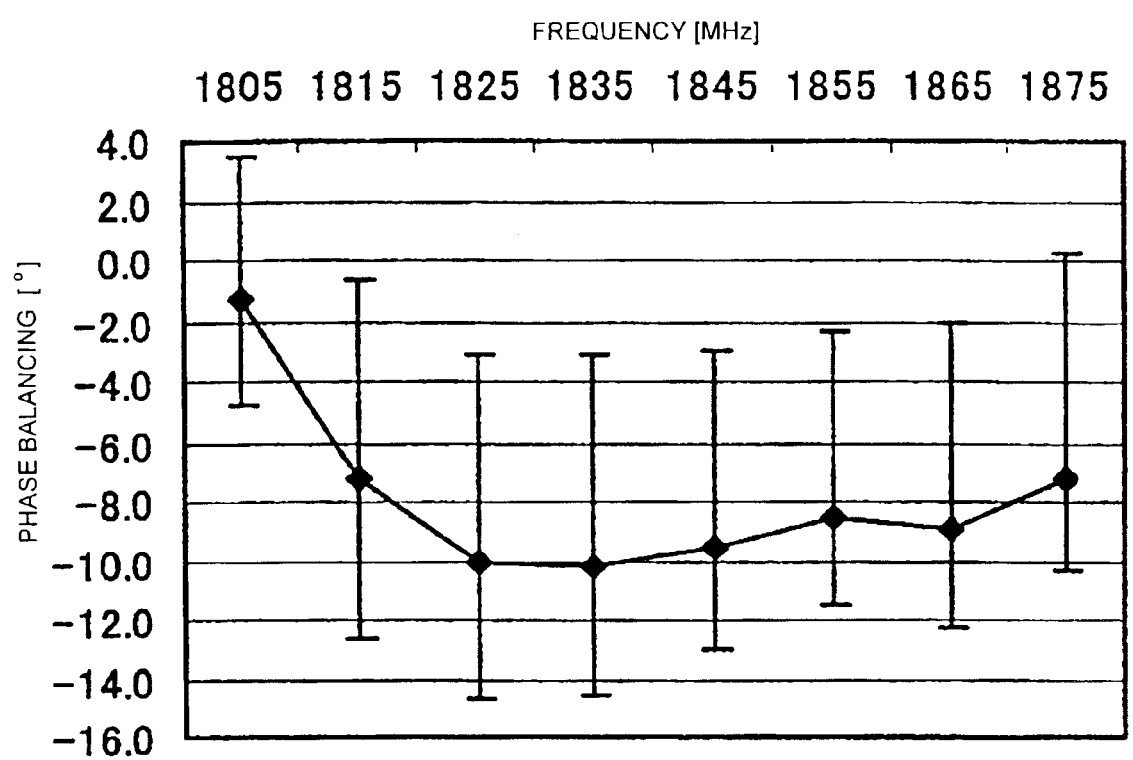
FIG. 13 is a graph showing the phase balancing in the passband of the surface acoustic wave device in FIG. 7.

In related products, as shown in the comparative examples in FIGS. 5 to 7, when the mounting position of the surface acoustic wave filter 1 and the coating position of the adhesive are varied, a difference in capacitance is likely to occur between the two surface acoustic wave filter elements, and, as a result, large variations are caused in the phase balancing in the passband, as shown in FIGS. 11 to 13.

Figure 8:
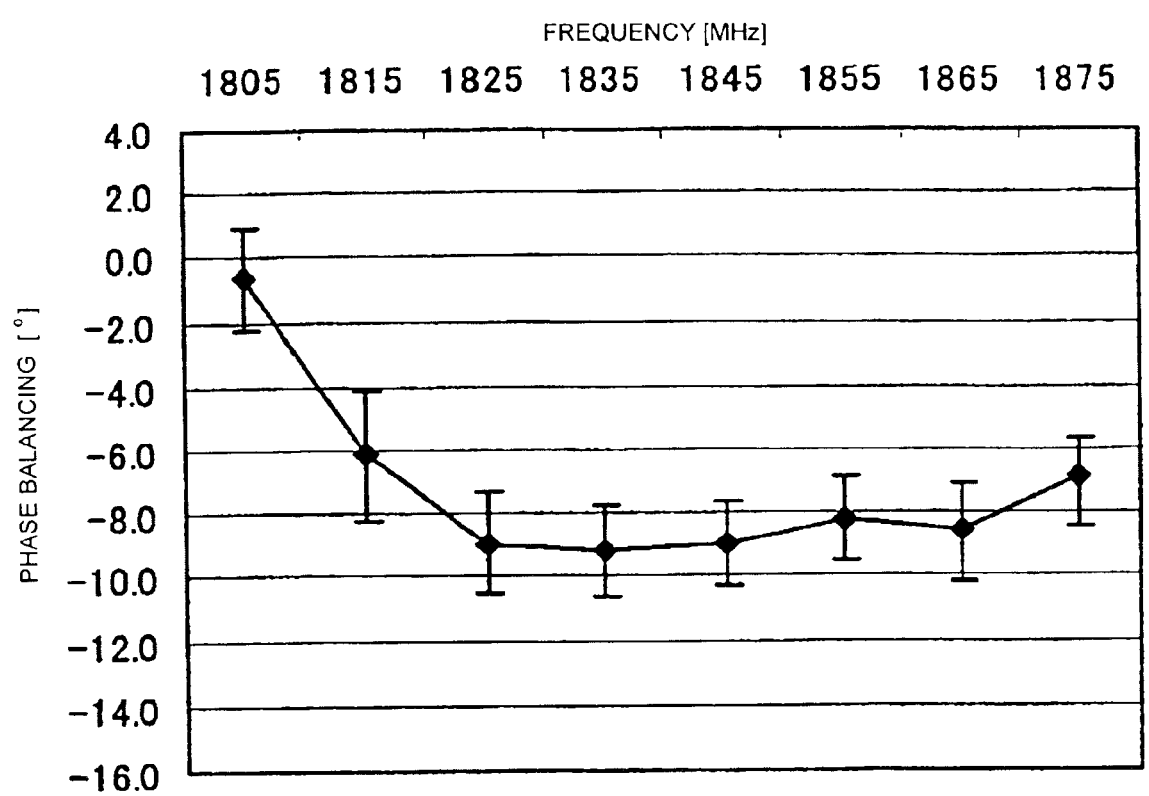
FIG. 8 is a graph showing the phase balancing in the passband of the surface acoustic wave device in FIG. 1.
Figure 9:
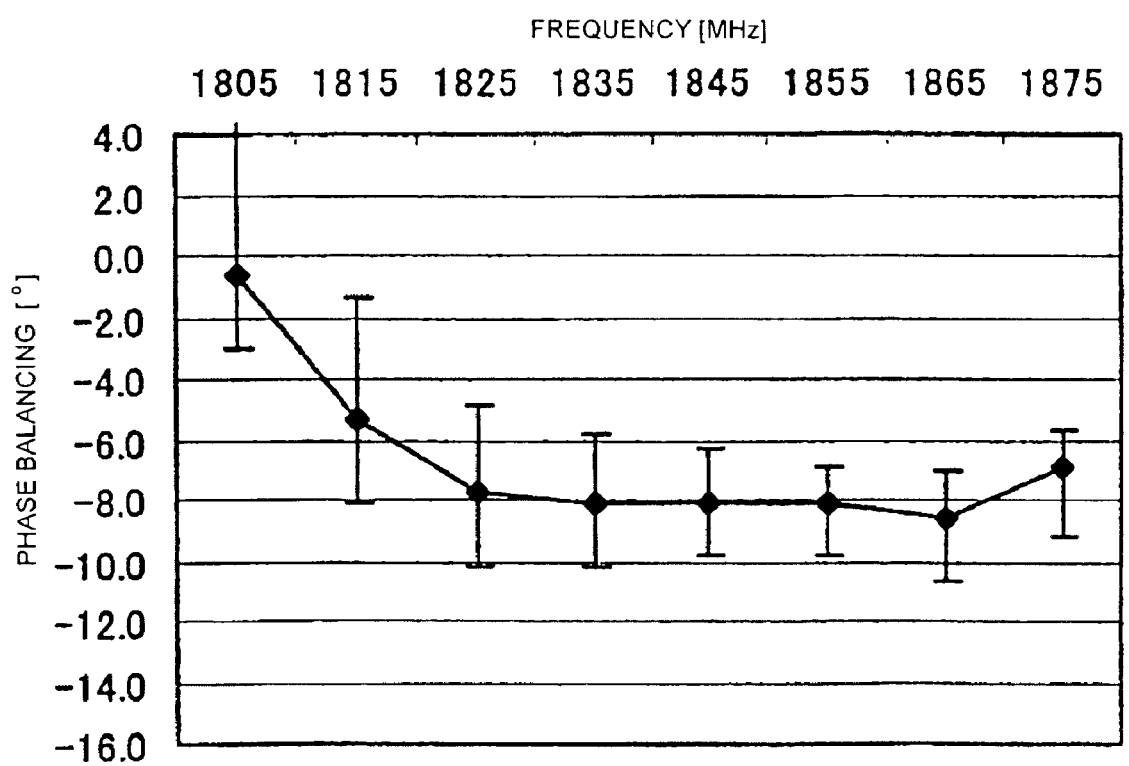
FIG. 9 is a graph showing the phase balancing in the passband of the surface acoustic wave device in FIG. 3.
Figure 10:
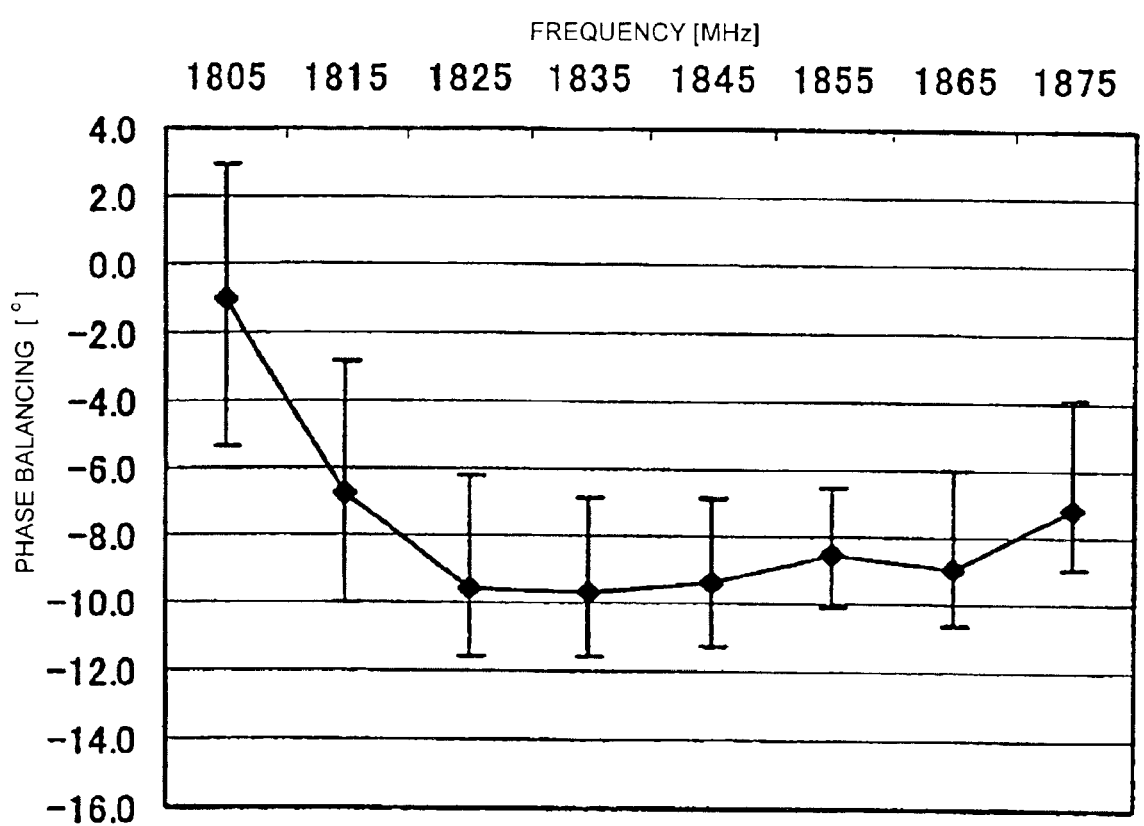
FIG. 10 is a graph showing the phase balancing in the passband of the surface acoustic wave device in FIG. 4.

However, as shown in FIG. 1 and FIGS. 3 and 4, even if the mounting position of the surface acoustic wave filter 1 and the coating position of the adhesive vary when the adhesive is applied at two locations, since a difference in grounding capacitance between the surface acoustic wave filter elements 101 and 102 is minimized, it is clear that variations in the phase balancing can be reduced, as shown in FIGS. 8 to 10.

On the other hand, a method for reducing variations in the phase balancing by improving the accuracy of coating positions of the adhesive and mounting positions of the piezoelectric substrate 30 can be used. However, the improvement in accuracy of the equipment is costly and time-consuming.

In contrast, it is possible to greatly improve the variations in the phase balancing without introducing any improvement in the accuracy of the equipment, but instead by using a method for applying the adhesive at two locations. A method for applying adhesive at two locations is used in the preferred embodiments of the present invention, and it is possible to further reduce variations in the phase balancing by increasing the number of coating locations to three, four, etc.

Figure 14:
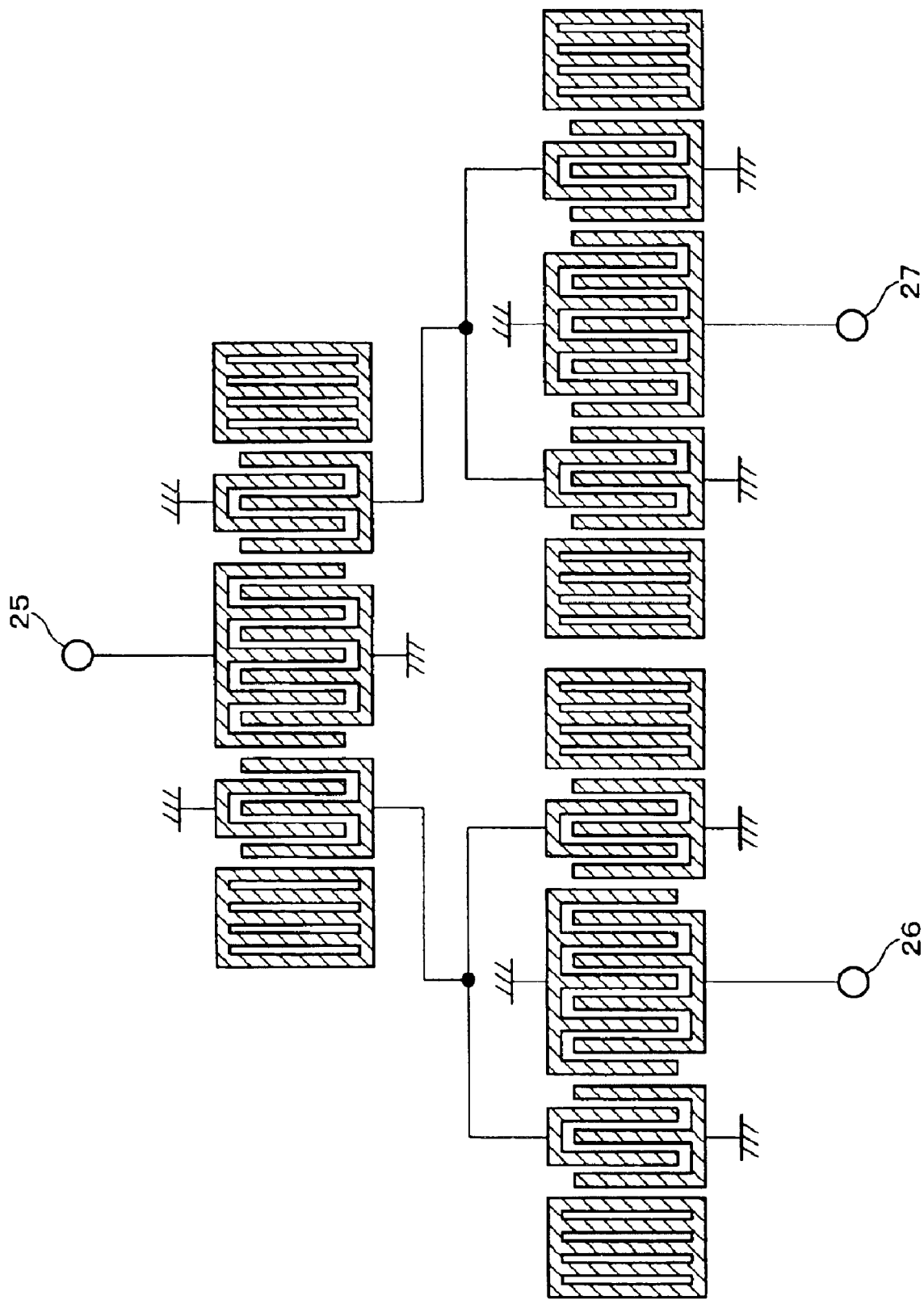
FIG. 14 shows the construction in outline of one modified example of the first preferred embodiment which is shown as a surface acoustic wave filter of a three-element construction.
Figure 15:
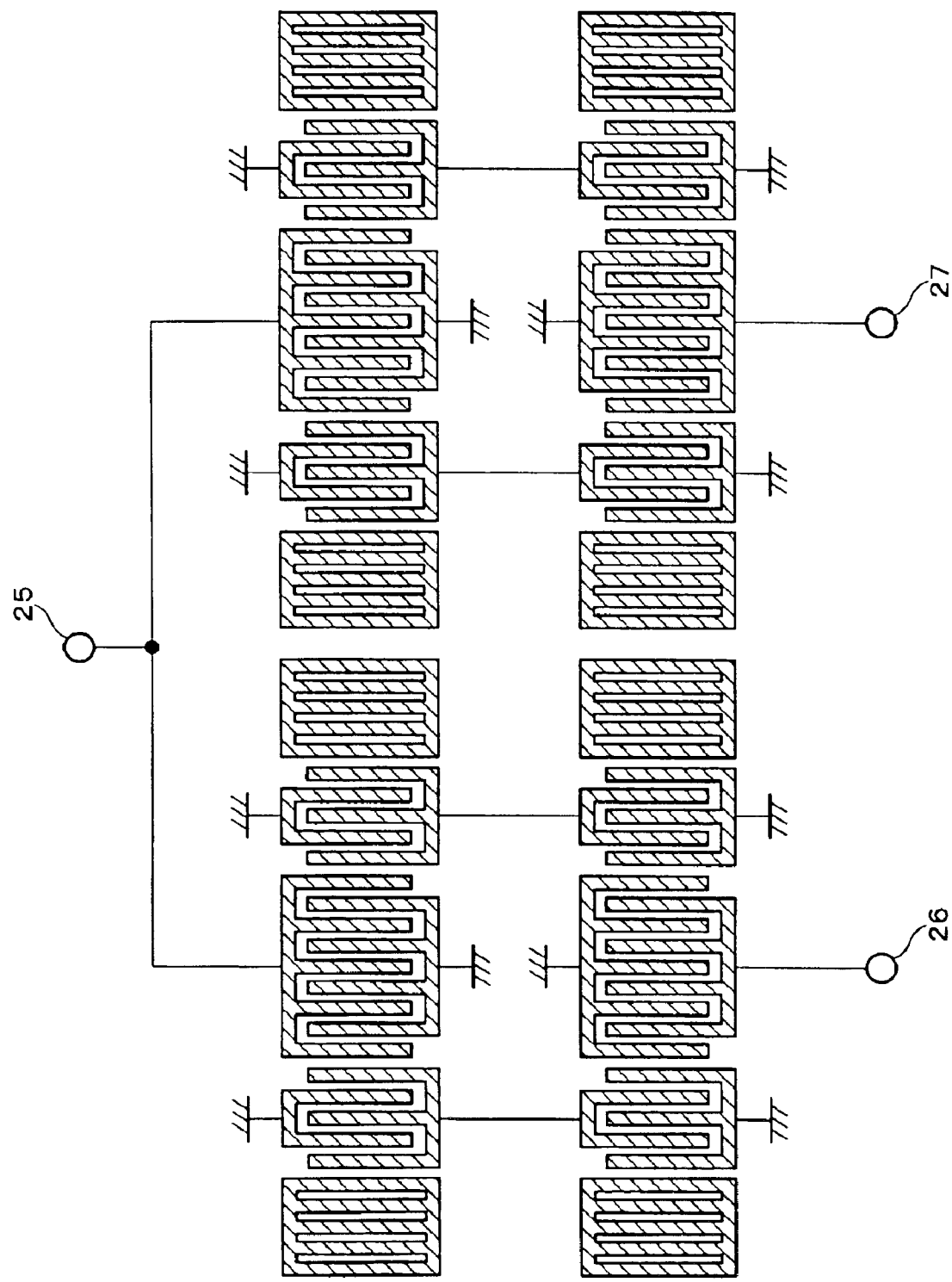
FIG. 15 shows the construction in outline of another modified example of the first preferred embodiment which is shown as a surface acoustic wave filter of a four-element construction.

Moreover, although the cases where two surface acoustic wave filters are used are shown in the present preferred embodiments, even if three or four surface acoustic wave filters are used, as shown in FIGS. 14 and 15, the same effects can be obtained.

In related products, when surface acoustic wave filters are mounted on a packaging member, in the case of wire bonding, the surface acoustic wave filters are die bonded to the packaging member by applying an adhesive at one location and then forming wires. However, when the surface acoustic wave filters are mounted on the packaging member, variations in the coating locations of the adhesive are caused and variations in the mounting locations of the surface acoustic wave filters also occur.

As a result of these variations, since the condition of the adhesive layer formed under one balanced terminal becomes different from the condition of the adhesive layer formed under the other balanced terminal, the capacitance between one balanced terminal and the surface of the packaging member, on which the chip is mounted, becomes different from the capacitance between the other balanced terminal and the surface of the packaging member, on which the chip is mounted, and accordingly, the balancing, particularly the phase balancing, greatly varies.

Although it has been considered to coat the whole area of the bottom surface of the piezoelectric substrate with adhesive in order to make conditions under which each adhesive layer corresponding to each balanced terminal is formed uniformly, when the whole area is coated with adhesive, the risk of bleedout, that is, the phenomenon of adhesive creeping up the side walls of wire bonding pads and chips, increases.

When adhesive attaches to the surface of a piezoelectric substrate chip due to bleedout, because the constants of the piezoelectric substrate change, satisfactory performance cannot be obtained. Furthermore, in the case of wire bonding, when adhesive sticks to wire bonding pads in the packaging member, the wire and the pad are not bonded, and even if they are bonded, the bonding force is insufficient.

It has also been considered to increase the amount of adhesive to be applied at one location, but it is difficult to uniformly spread out the adhesive across the bottom surface of the piezoelectric substrate when applying it at one location. If the amount of adhesive is increased and spread out across the whole area of the bottom surface of the piezoelectric substrate, creepage (bleedout) occurs, and, if the amount of adhesive is reduced in order to avoid creepage, the adhesive does not spread over the whole area of the bottom surface of the piezoelectric substrate, resulting in a difference in capacitance between the balanced terminals and variations in the phase balancing.

As described above, the coating of adhesive at two or more locations is effective in order to prevent creepage, to uniformly spread out the adhesive over a wide area of the bottom surface of the piezoelectric substrate as much as possible, and, as a result, to easily and effectively reduce variations in the phase balancing. In the case of applying adhesive at two or more locations, since a substantially rectangular chip-like piezoelectric substrate is coated with adhesive at two or more locations, the adhesive is likely to effectively spread out over the whole area of the bottom surface of the piezoelectric substrate.

Moreover, even if the whole area of the bottom surface of the chip-like piezoelectric substrate 30 is not covered with the adhesive layers 3, when the areas underneath the surface acoustic wave filter elements are covered with the adhesive layers 3, the effects and advantages of the present invention can be still achieved.

Second Preferred Embodiment

Figure 16:
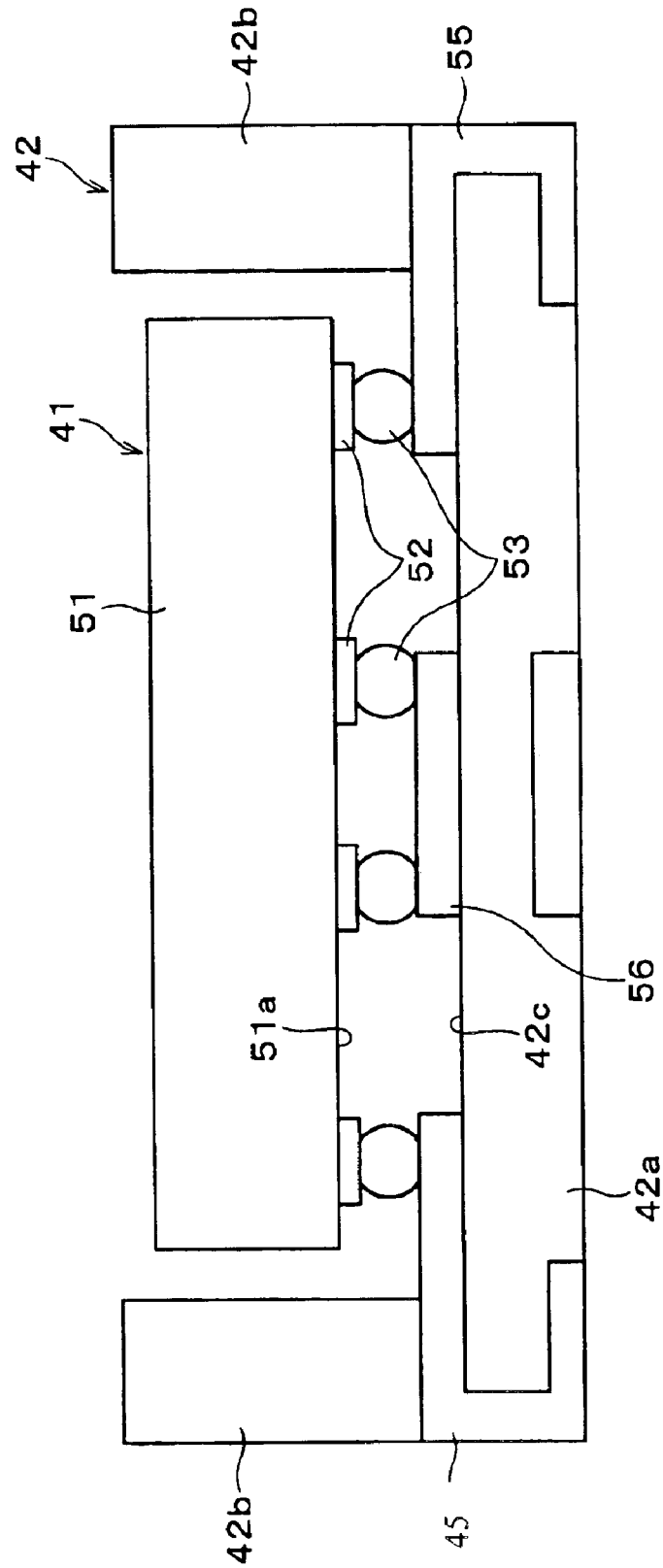
FIG. 16 is a sectional view of the essential part of a surface acoustic wave device according to a second preferred embodiment of the present invention, in which the device is mounted by flip chip bonding.

In a surface acoustic wave device according to a second preferred embodiment of the present invention, as shown in FIG. 16, a surface acoustic wave filter 41 in which IDTs, etc. are preferably formed in the same way as in the surface acoustic wave filter 1 is mounted on a packaging member 42 such that the surface on which the electrodes of IDTs, etc. are formed faces downward. In a piezoelectric substrate 51 of the surface acoustic wave filter 41 having a balanced-to-unbalanced conversion function, electrode pads 52 are provided on a surface 51a facing the packaging member 42. Furthermore, metal bumps 53 made of, for example, gold or an alloy containing gold are disposed on the electrode pads 52.

On the other hand, the packaging member 42 housing the surface acoustic wave filter 41 includes a substrate 42a made of an insulating substrate preferably formed of ceramic or other suitable material, and side walls 42b. The substrate 42a is substantially in the form of a rectangular plate. The side walls 42b stand on the four sides of the substrate 42a so as to be adjacent to each other.

Furthermore, in the packaging member 42, electrode terminals 45 and 55 and a die attachment member (grounding electrode) 56 disposed between the electrode terminals 45 and 55 are provided on the substrate 42a.

In the surface acoustic wave filter 41, the surface 51a of the piezoelectric substrate 51 where the IDTs and electrode pads are located are arranged to face the surface 42c having the die attachment member (grounding electrode) 56 in the packaging member 42 and electrically and mechanically connected to the packaging member 42 through the metal bumps 53 on the electrode pads 52.

Figure 17:
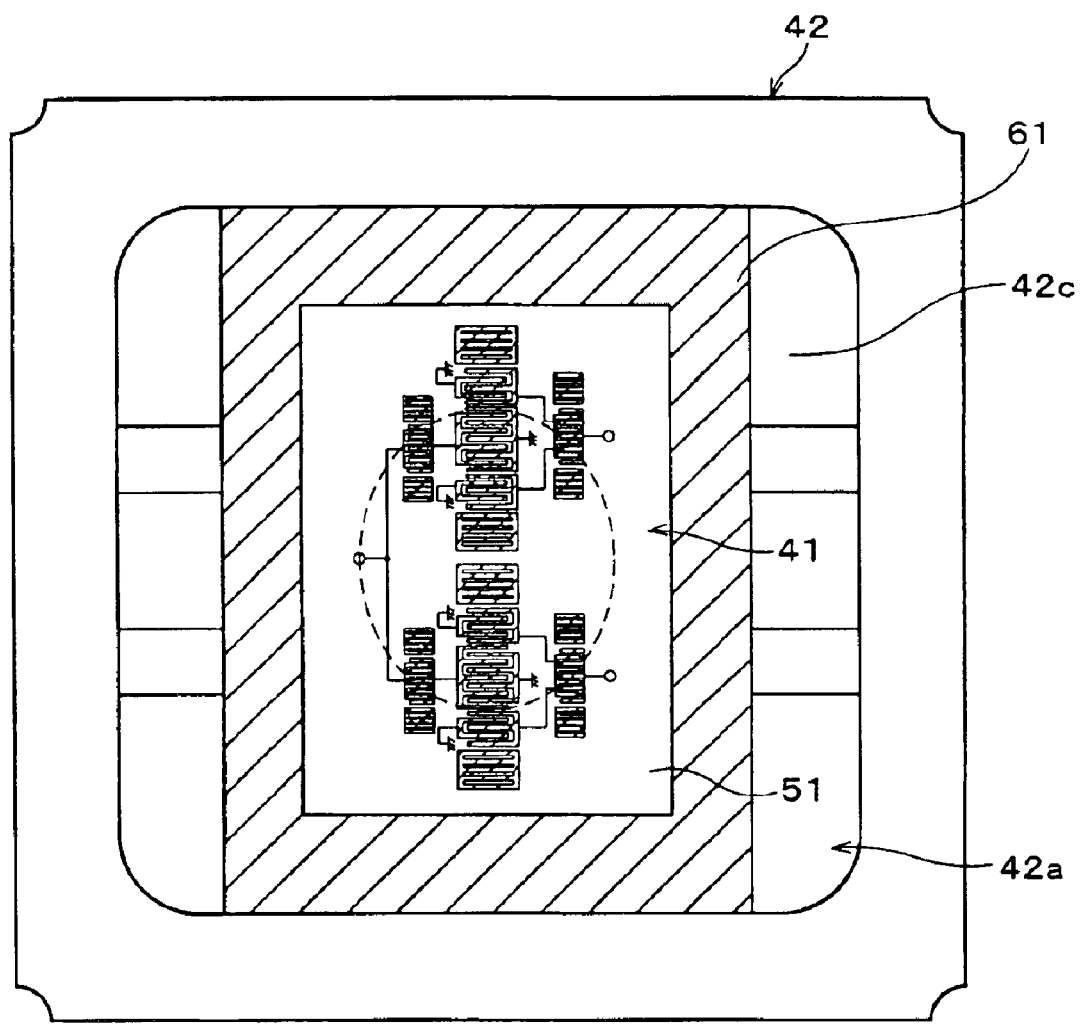
FIG. 17 is a top view of the surface acoustic wave device in which the whole area of a surface for fixing the piezoelectric substrate on the packaging member is metalized.
Figure 18:
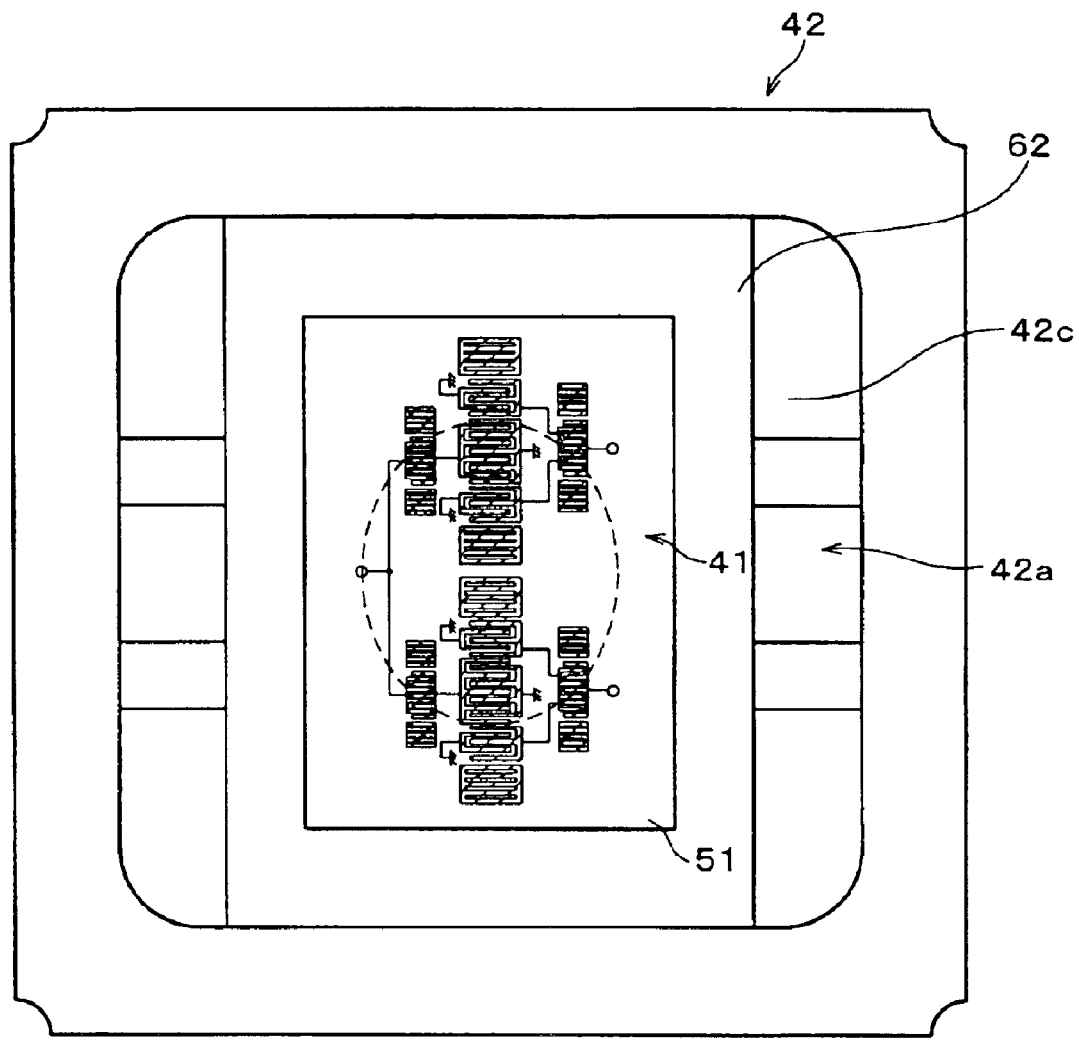
FIG. 18 is a top view of the surface acoustic wave device in which the whole area of a surface for fixing the piezoelectric substrate on the packaging member is not metalized.

When the piezoelectric substrate 51 is die bonded (fixed) to the packaging member 42 by adhesive, substantially the whole area of the surface 42c of the substrate 42a, functioning as a die bonding surface, is formed as a metalized area 61, as shown in FIG. 17, or as a non-metalized area 62, as shown in FIG. 18, which reduces variations in the phase balancing.

Figure 19:
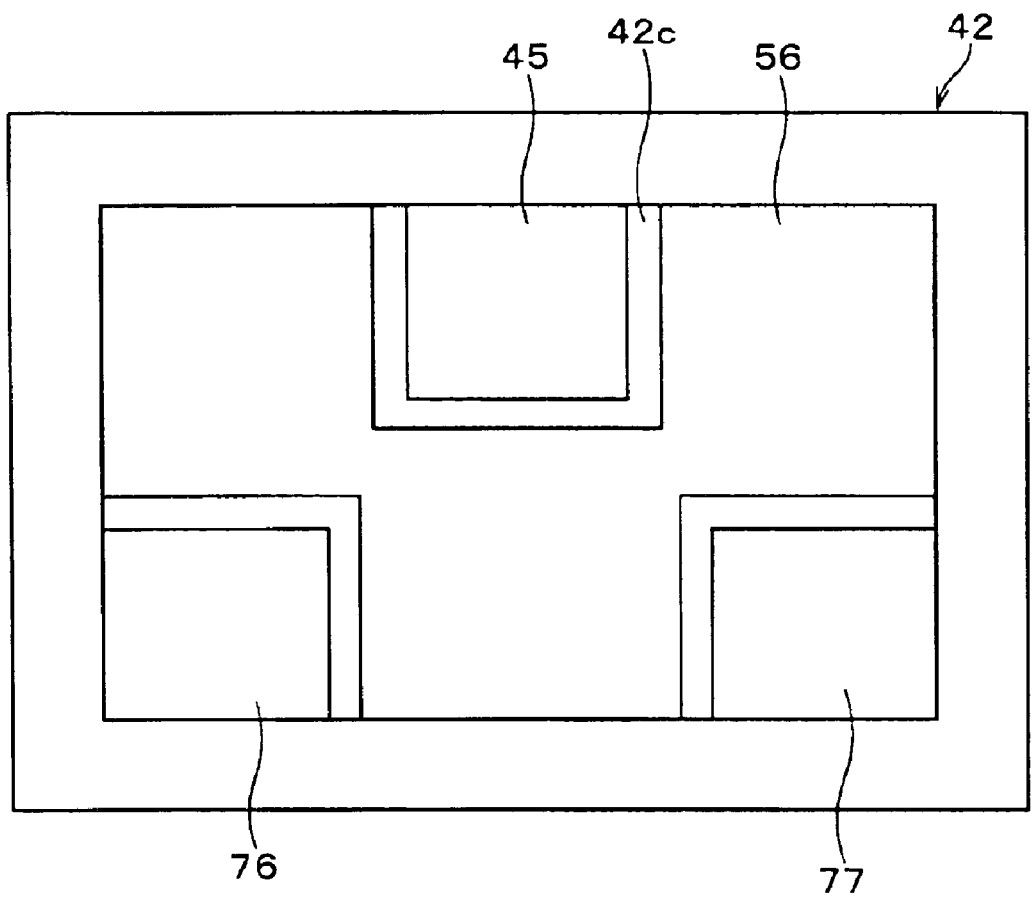
FIG. 19 is a top view of a packaging member of the surface acoustic wave device.

Furthermore, as shown in FIG. 19, it is desirable that, when viewed from the electrodes connected to the output terminals of a balanced signal, the metalized patterns on the surface 42c, on which the piezoelectric substrate 51 is mounted, in the packaging member 42, that is, the electrode terminals 45, 76, and 77 and the die attachment part 56, are symmetrical.

Figure 20:
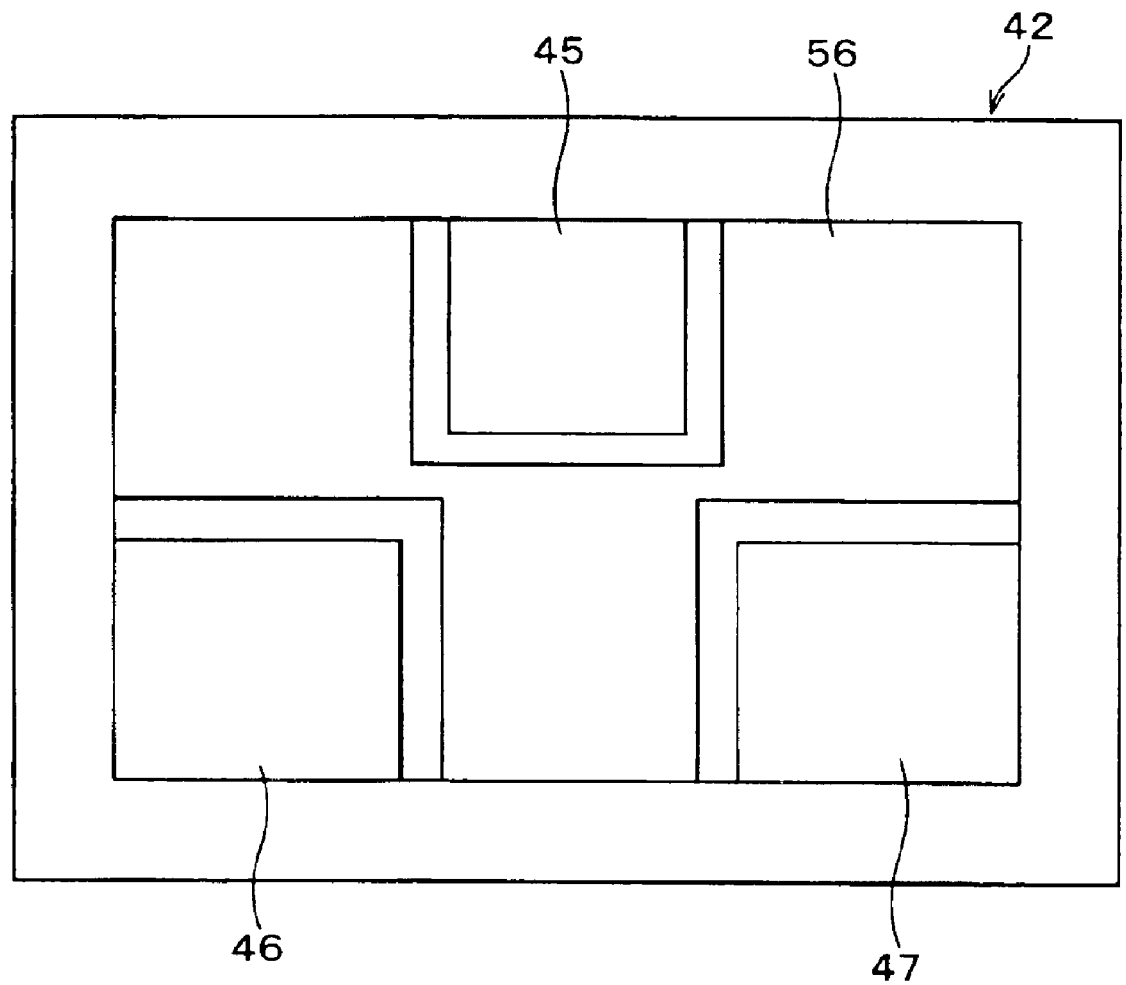
FIG. 20 is a top view of another packaging member of the surface acoustic wave device.

Moreover, as shown in FIG. 20, it is desirable that, in the packaging member 42, the electrode terminals 46 and 47, which are connected to the balanced terminals on the mounting surface including the die attachment part 56 of the piezoelectric substrate 51 are wider, that is, larger in area, than the electrodes connected to the output terminals of a balanced signal and wider than the electrode terminal 45 connected to the unbalanced terminal.

In this way, a difference in capacitance between the electrodes connected to the balanced terminals is minimized and preferably the capacitances can be made substantially the same, which greatly improves the phase balancing.

Figure 21:
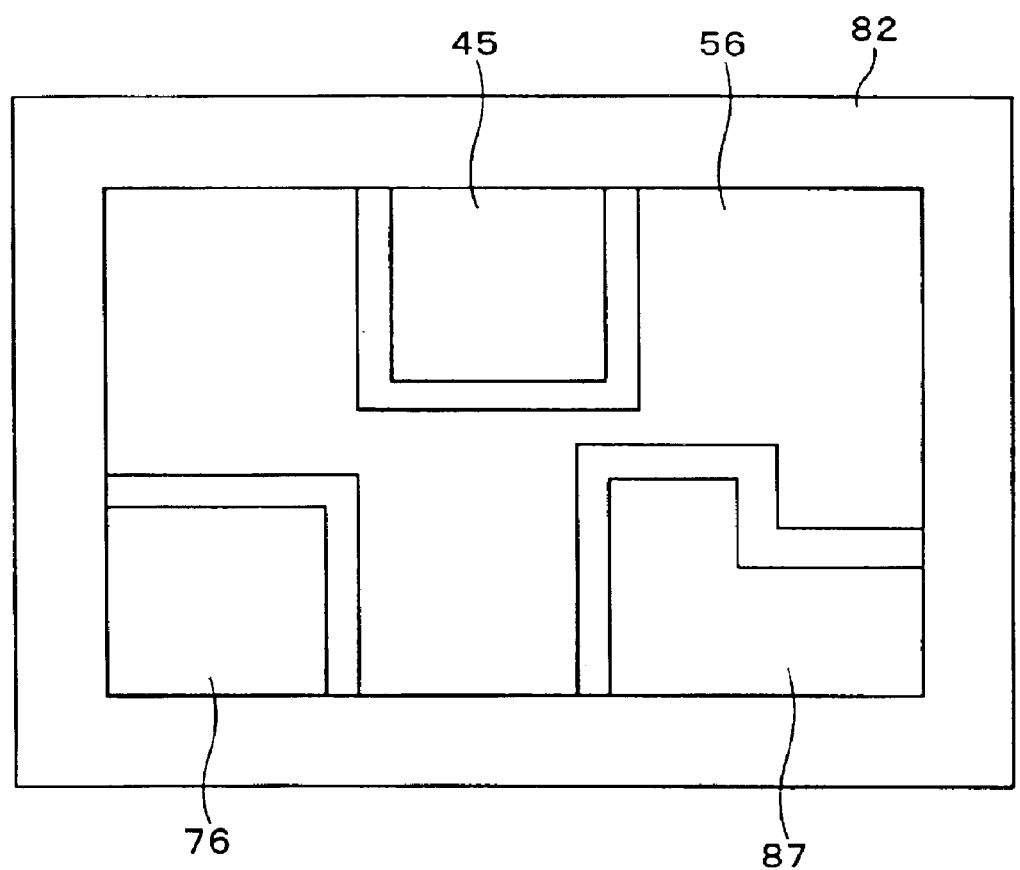
FIG. 21 is a top view of a comparative packaging member.
Figure 22:
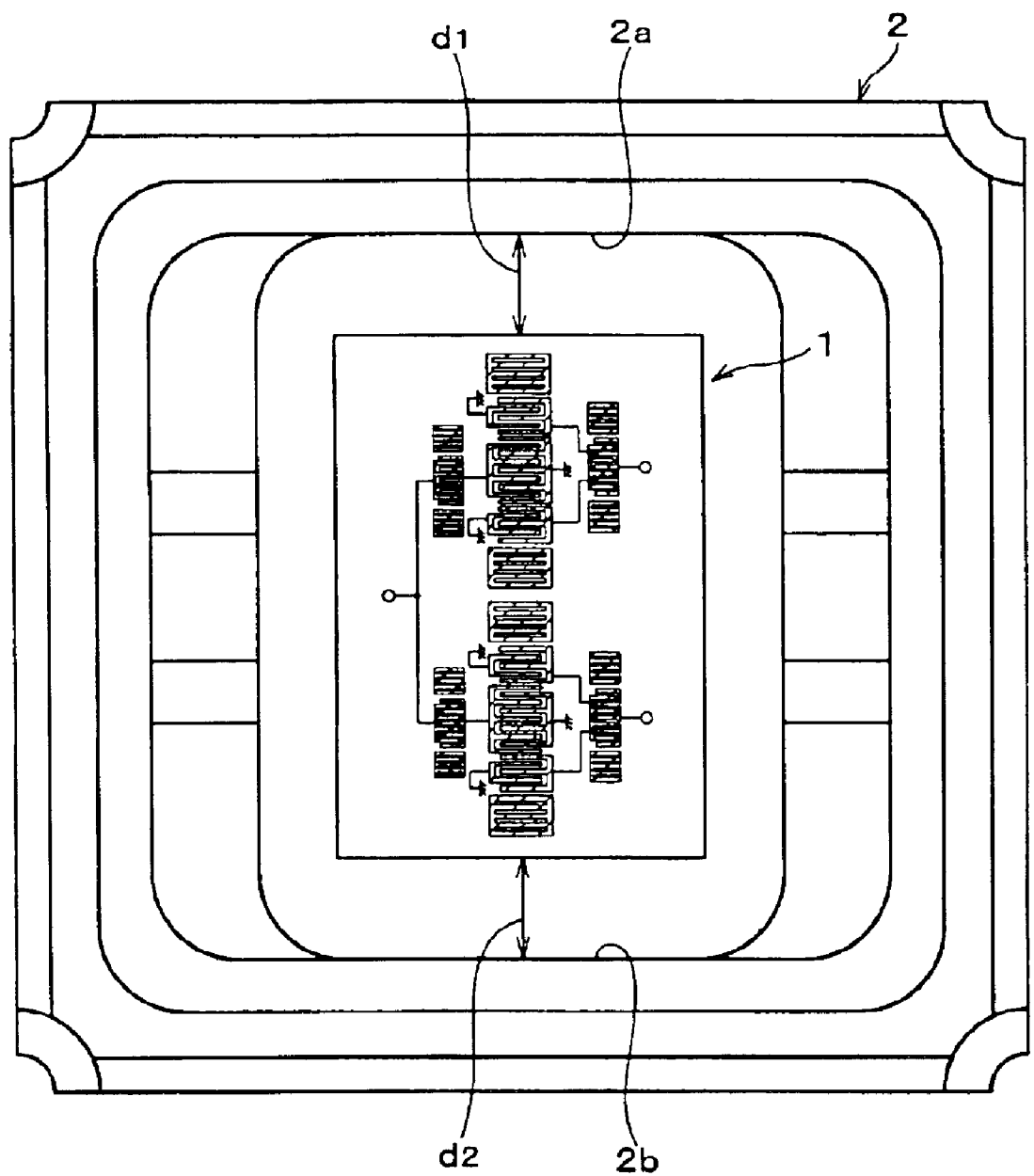
FIG. 22 is a surface acoustic wave device according to a third preferred embodiment of the present invention, the device being not yet sealed with a cap.

On the other hand, as in a packaging member, as a comparative example, shown in FIG. 21, when a metalized pattern 76 is the same size or smaller than the electrodes connected to output terminals of a balanced signal, or when a metalized pattern 87 is asymmetrical, the phase balancing may deteriorate.

Hereinafter, the effects and advantages of the present second preferred embodiment will be described.

The metalized pattern of the die attachment member 56 of the packaging member 42 is made symmetrical, when viewed from the electrodes connected to the output terminals of a balanced signal of the surface acoustic wave filter 41 disposed on the piezoelectric substrate 51, and furthermore, the metalized pattern of the packaging member 42 connected to the output terminals of a balanced signal of the surface acoustic wave filter 41 is widened so as to include the whole area in consideration of the displacement of the mounting position when the piezoelectric substrate 51 is mounted by flip chip bonding. Thus, even if displacement in the mounting position occurs when the piezoelectric substrate 51 is mounted by flip chip bonding, hardly any difference in capacitance between the output terminals of a balanced signal occurs, and accordingly variations in the phase balancing can be minimized.

Furthermore, when the roughness of the bottom surface of the piezoelectric substrate 51 is made substantially uniform, the accuracy of mounting by flip chip bonding is improved and hardly any difference in capacitance between the output terminals of a balanced signal occurs, and accordingly variations in the phase balancing can be minimized.

Moreover, as another method for improving the balancing at mounting time, making the roughness of the bottom surface (bond area) of the piezoelectric substrates 30 and 51 substantially uniform can be used. When the surface roughness is dependent on the surface acoustic wave filter 1, in the mounting by flip chip bonding (FCB), when a supersonic wave is applied at mounting time, the friction coefficient between supersonic wave application mechanism and the surface acoustic wave filter 1 becomes different, variations in displacement occur at mounting time, and the phase balancing may deteriorate.

Third Preferred Embodiment

Figure 23:
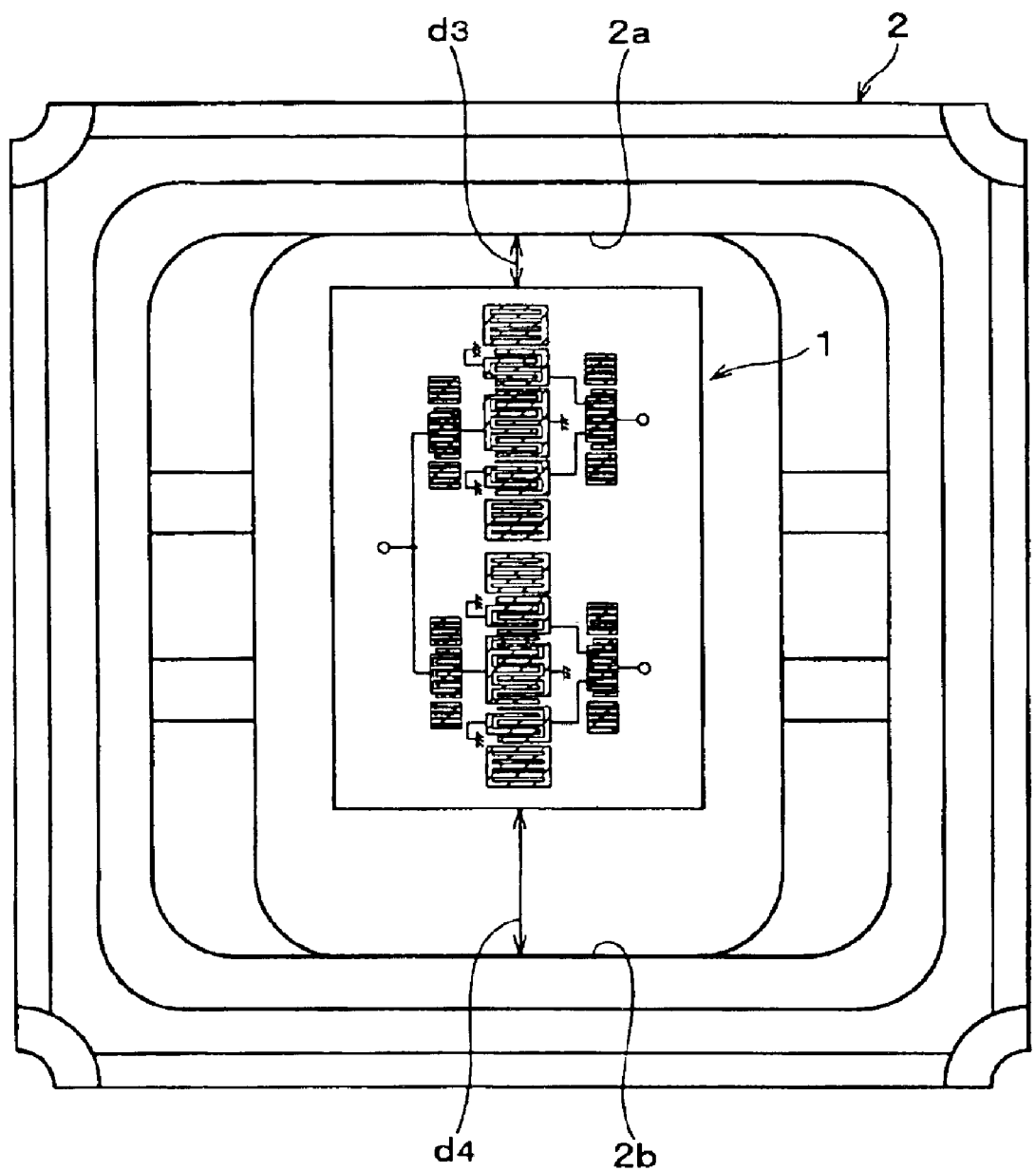
FIG. 23 is a top view of the comparative surface acoustic wave device, in which the surface acoustic wave filter is displaced.

In a surface acoustic wave device according to a third preferred embodiment of the present invention, it is desirable that, as another construction in which a difference in capacitance between balanced terminals is reduced, a surface acoustic wave filter 1 is disposed inside a packaging member 2 so that the difference between distances d1 and d2 between the end surfaces in the length direction of the surface acoustic wave filter 1 and the side walls 2a and 2b, facing the end surfaces, of the packaging member 2 may be reduced, and preferably to zero. In this way, in the surface acoustic wave device shown in FIG. 22, when compared with the case where the difference between distances d3 and d4 is large, as shown in FIG. 23, the difference in capacitance between the balanced terminals can be reduced and variations in the phase balancing in particular can be minimized. Such a construction is also effective in the second preferred embodiment of the present invention.

Figure 24A:
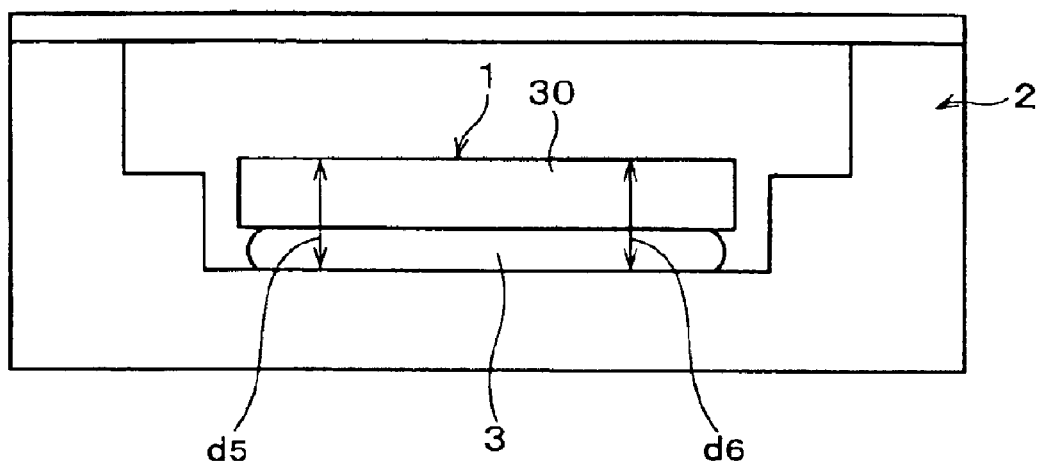
FIGS. 24A and 24B are sectional views showing how the surface acoustic wave filter of the surface acoustic wave device is housed, the surface acoustic wave filter being substantially parallel to the packaging member in FIG. 24A and is inclined with respect to the packaging member in FIG. 24B, for comparison.
Figure 24B:
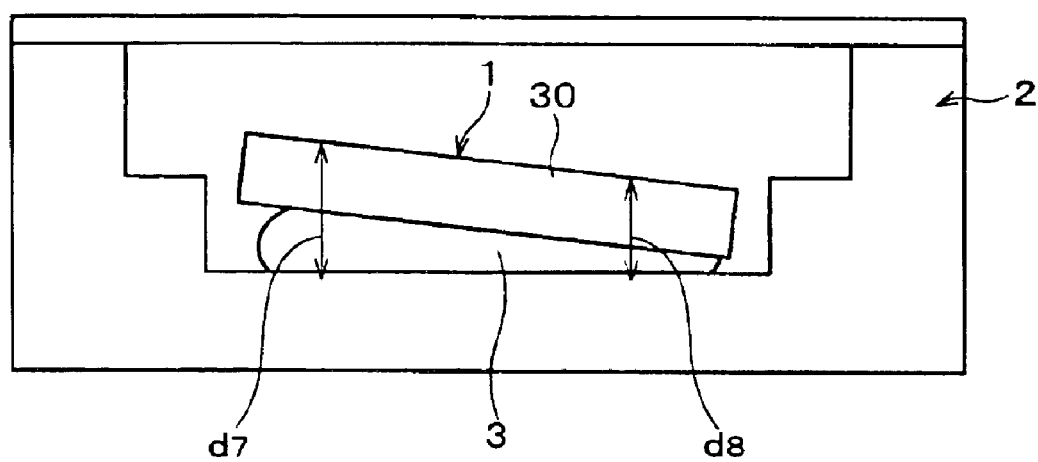

Furthermore, it is desirable that the surface acoustic wave filter 1 is disposed inside the packaging member 2 so that the difference between distances d5 and d6 between balanced terminals on a piezoelectric substrate 30 and a metalized pattern on the bottom surface of a packaging member 2 may be reduced, and preferably to zero. In this way, in the surface acoustic wave device shown in FIG. 22, when compared with the case where the difference between distances d7 and d8 is large, as shown in FIG. 24B, the difference in capacitance between the balanced terminals can be reduced, and variations in the phase balancing in particular can be minimized. Such a construction is also effective in the second preferred embodiment of the present invention.

Furthermore, as another method for improving the balancing at mounting time, making the thickness of the piezoelectric substrates 30 and 51 substantially uniform is also effective. If the thickness of the piezoelectric substrate is uneven, the distance between the piezoelectric substrate and the packaging member at one balanced terminal is different from that at the other balanced terminal and, as a result, the balancing may deteriorate.

Figure 25:
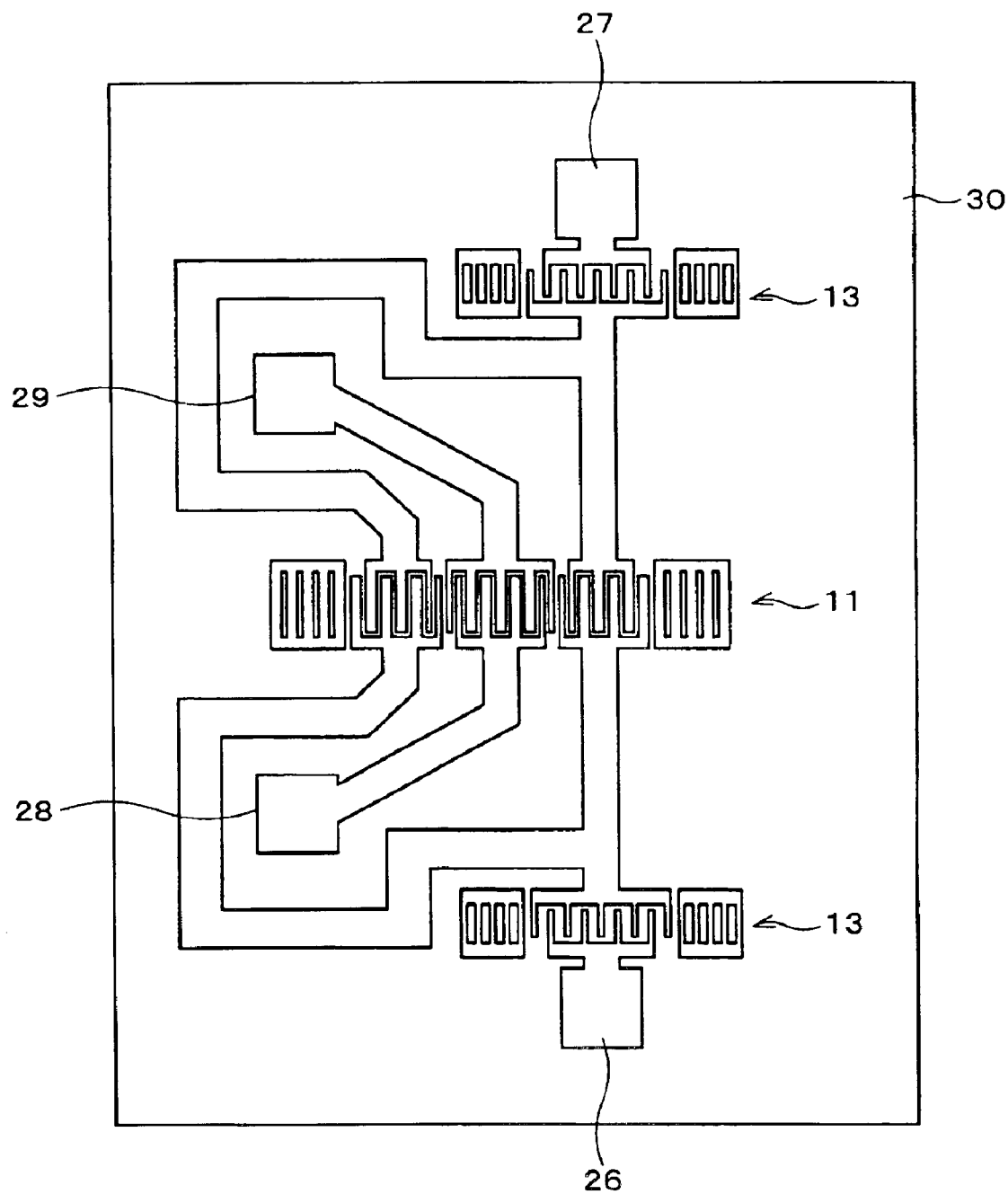
FIG. 25 shows the construction in outline of one modified example of the surface acoustic wave device.

Moreover, in each of the above-described preferred embodiments, although a surface acoustic wave device having a balanced-to-unbalanced conversion function is used, without limiting the use to that, even in a surface acoustic wave device having balanced input terminals and balanced output terminals, the effects and advantages of the present invention can be achieved. In FIG. 25, the balanced terminals 26 and 27 are on the output side, and the balanced terminals 28 and 29 are on the input side.

Fourth Preferred Embodiment

Figure 26:
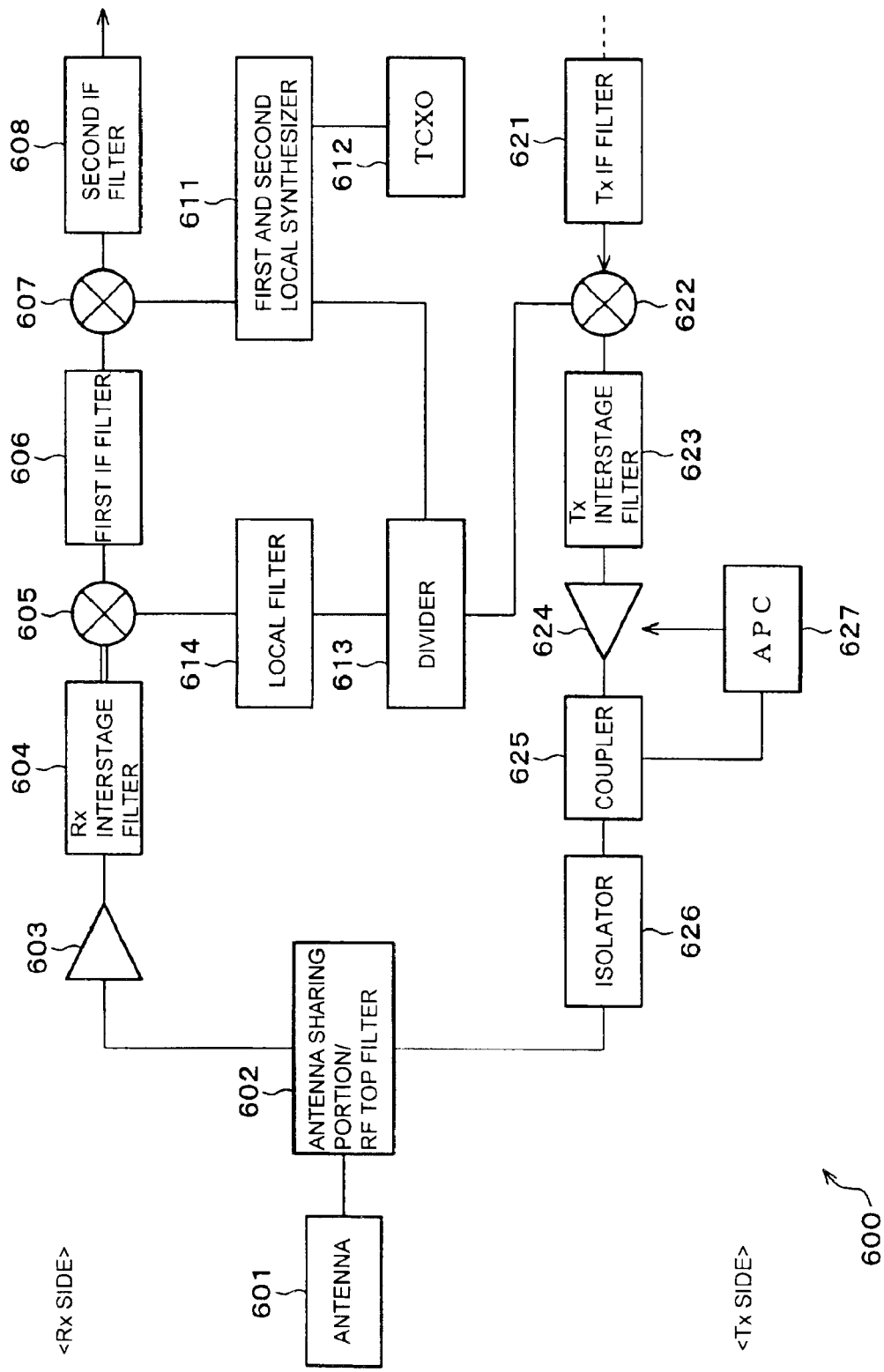
FIG. 26 is a block diagram of a communication device of a preferred embodiment of the present invention.

Next, a communication device according to the present invention, in which a surface acoustic wave device of the above-described preferred embodiments is mounted, is described with reference to FIG. 26. As shown in FIG. 26, in the communication device 600, the receiver side (Rx side) for reception includes an antenna 601, an antenna sharing portion/RF top filter 602, an amplifier 603, an $R_x$ interstage filter 604, a mixer 605, a first IF filter 606, a mixer 607, a second IF filter 608, first and second synthesizers 611, a TCXO (temperature compensated crystal oscillator) 612, a driver 613, and a local filter 614.

As shown by a double line in FIG. 26, it is desirable to transmit balanced signals from the $R_x$ interstage filter 604 to the mixer 605 to ensure balancing.

Furthermore, in the communication device 600, the transmitter side ($T_x$ side) for transmission includes the antenna 601, the antenna sharing portion/RF top filter 602, a $T_x$ IF filter 621, a mixer 622, a $T_x$ interstage filter 623, an amplifier 624, a coupler 625, an isolator 626, and an APC (automatic power control) 627.

Then, in the above $R_x$ interstage filter 604, first IF filter 606, $T_x$ IF filter 621, and $T_x$ interstage filter 623, surface acoustic wave devices according to the first to seventh preferred embodiments can be preferably utilized.

A surface acoustic wave device according to various preferred embodiments of the present invention has a balanced-to-unbalanced conversion function together with a filtering function. In addition, the amplitude characteristics between balanced signals are close to ideal, which is an advantageous feature. Therefore, in a communication device using the above-described surface acoustic wave device according to preferred embodiments of the present invention, the transmission characteristics can be improved.

As described above, a surface acoustic wave device preferably includes a piezoelectric substrate, one or more surface acoustic wave filters having at least two IDTs arranged along the propagation direction of a surface acoustic wave on the piezoelectric substrate and first and second balance terminals connected to the IDTs, and a packaging member for housing the surface acoustic wave filter. The surface acoustic wave filter is housed in the packaging member so that a difference in capacitance between electrodes connected to the first and second balanced terminals on the piezoelectric substrate is effectively minimized.

Therefore, since the above-described construction allows the difference in capacitance between electrodes to be reduced, an effect of improving variations in the balancing between electrodes, particularly the phase balancing in the passband, can be achieved.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
    a piezoelectric substrate;
    at least one surface acoustic wave fitter including at least two comb-shaped erectrode portions arranged along a propagation direction of a surface acoustic wave on the piezoelectric substrate, and first and second balanced terminals connected to the comb-shaped electrode portions; and
    a packaging member for housing the at least one surface acoustic wave filter;
    wherein the surface acoustic wave filter is housed in the packaging member such that a capacitance generated at an electrode on the piezoelectric substrate which is connected to the first balanced terminal is substantially equal to a capacitance generated at an electrode on the piezoelectric substrate which is connected to the second balanced terminal.

2. A surface acoustic wave device as set forth in claim 1, wherein the surface acoustic wave device is fixed to the packaging member by an adhesive layer, and the adhesive layer is disposed at least between the first balanced terminal and the packaging member and between the second balanced terminal and the packaging member.

3. A surface acoustic wave device as set forth in claim 2, wherein the surface acoustic wave filter is fixed to the packaging member by adhesive layers at two or more locations.

4. A surface acoustic wave device as set forth in claim 2, wherein the adhesive layer is has a wider area than the electrodes on the piezoelectric substrate which are connected to the first and second balanced terminals.

5. A surface acoustic wave device as set forth in claim 2, wherein substantially the whole area of a surface of the packaging member on which the surface acoustic wave filter is mounted is metallized.

6. A surface acoustic wave device as set forth in claim 2, wherein substantially the whole area of a surface of the packaging member on which the surface acoustic wave filter is mounted is not metallic.

7. A surface acoustic wave device as set forth in claim 1, wherein the surface acoustic wave filter is flip-chip bonded to the packaging member, and metallized patterns are disposed on a surface of the packaging member, on which the surface acoustic wave filter is mounted, to be connected to lead-out electrodes connected to the first and second balanced terminals, and the metallized patterns are wider than the read-out electrodes connected to the first and second balanced terminals.

8. A surface acoustic wave device as set forth in claim 7, wherein the metallized patterns disposed on a surface of the packaging member, on which the surface acoustic wave filter is mounted, are symmetrical.

9. A surface acoustic wave device as set forth in claim 1, wherein a distance between the electrode on the piezoelectric substrate connected to the first balanced terminal and the packaging member is substantially equal to a distance between the electrode on the piezoelectric substrate connected to the second balanced terminal and the packaging member.

10. A surface acoustic wave device as set forth in claim 1, wherein a distance between the electrode on the piezoelectric substrate connected to the first balanced terminal and the side wall of the packaging member is substantially equal to a distance between the electrode on the piezoelectric substrate connected to the second balanced terminal and the side wall of the packaging member.

11. A surface acoustic wave device as set forth in claim 1, wherein a distance between the electrode on the piezoelectric substrate connected to the first balanced terminal and the metallized pattern of the packaging member is substantially equal to a distance between the electrode on the piezoelectric substrate connected to the second balanced terminal and the metallized pattern of the packaging member.

12. A surface acoustic wave device as set forth in claim 1, wherein the surface acoustic wave filter has a balanced-to-unbalanced conversion function.

13. A surface acoustic wave device as set forth in claim 1, wherein a balanced input and a balanced output are provided on the surface acoustic wave filter.

14. A communication device comprising a surface acoustic wave device as set forth in claim 1.

15. A surface acoustic wave device comprising:
a piezoelectric substrate;
at least one surface acoustic wave filter including at least two comb-shaped electrode portions arranged along a propagation direction of a surface acoustic wave on the piezoelectric substrate, and first and second balanced terminals connected to the comb-shaped electrode portions; and
a packaging member for housing the at least one surface acoustic wave filter;
wherein the surface acoustic wave filter is fixed to the packaging member by adhesive layers at two or more locations, at least between the first balanced terminal and the packaging member and between the second balanced terminal and the packaging member.

16. A surface acoustic wave device as set forth in claim 15, wherein each of the adhesive layers has a wider area than the electrodes on the piezoelectric substrate which are connected to the first and second balanced terminals.

17. A surface acoustic wave device as set forth in claim 15, wherein the surface acoustic wave filter is flip-chip bonded to the packaging member, and metallized patterns are disposed on a surface of the packaging member, on which the surface acoustic wave filter is mounted, to be connected to lead-out electrodes connected to the first and second balanced terminals, and the metallized patterns are wider than the lead-out electrodes connected to the first and second balanced terminals.

18. A surface acoustic wave device as set forth in claim 17, wherein the metallized patterns disposed on a surface of the packaging member, on which the surface acoustic wave filter is mounted, are symmetrical.

19. A surface acoustic wave device as set forth in claim 15, wherein a distance between the electrode on the piezoelectric substrate connected to the first balanced terminal and the packaging member is substantially equal to a distance between the electrode on the piezoelectric substrate connected to the second balanced terminal and the packaging member.

20. A surface acoustic wave device as set forth in claim 15, wherein the surface acoustic wave filter has a balanced-to-unbalanced conversion function.

21. A surface acoustic wave device as set forth in claim 15, wherein a balanced input and a balanced output are provided on the surface acoustic wave filter.

22. A communication device comprising a surface acoustic wave device as set forth in claim 15.

* * * * *